(12) United States Patent
Cheng et al.

(10) Patent No.: US 9,431,523 B2
(45) Date of Patent: Aug. 30, 2016

(54) LOCAL THINNING OF SEMICONDUCTOR FINS

(71) Applicant: GLOBALFOUNDRIES INC., Grand Cayman (KY)

(72) Inventors: Kangguo Cheng, Schenectady, NY (US); Ramachandra Divakaruni, Ossining, NY (US); Carl J. Radens, LaGrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 85 days.

(21) Appl. No.: 14/156,489

(22) Filed: Jan. 16, 2014

(65) Prior Publication Data

US 2015/0200276 A1    Jul. 16, 2015

(51) Int. Cl.
*H01L 21/336* (2006.01)
*H01L 29/66* (2006.01)
*H01L 29/78* (2006.01)

(52) U.S. Cl.
CPC ....... *H01L 29/66818* (2013.01); *H01L 29/785* (2013.01)

(58) Field of Classification Search
CPC ................................ H01L 29/66818
USPC .......................... 438/283; 257/401
See application file for complete search history.

(56) References Cited

U.S. PATENT DOCUMENTS

| | | |
|---|---|---|
| 7,626,183 B2 | 12/2009 | Wagner et al. |
| 8,193,094 B2 | 6/2012 | Wang |
| 8,237,136 B2 | 8/2012 | Hautala et al. |
| 8,373,238 B2 | 2/2013 | Lee et al. |
| 2009/0166723 A1* | 7/2009 | Sung ................ H01L 27/10876 257/328 |
| 2010/0283064 A1* | 11/2010 | Samuelson ............ B82Y 20/00 257/88 |
| 2011/0049629 A1 | 3/2011 | Ishikawa et al. |
| 2012/0217587 A1 | 8/2012 | Wang |
| 2012/0313169 A1* | 12/2012 | Wahl ............... H01L 21/823431 257/347 |
| 2013/0093026 A1* | 4/2013 | Wann ............. H01L 21/823821 257/401 |
| 2013/0161729 A1 | 6/2013 | Xie |
| 2013/0187235 A1* | 7/2013 | Huang ............ H01L 21/823821 257/369 |
| 2013/0292805 A1* | 11/2013 | Cai .................... H01L 29/66795 257/622 |
| 2014/0145248 A1* | 5/2014 | Cheng ................ H01L 21/02227 257/288 |
| 2014/0197456 A1* | 7/2014 | Wang .................... H01L 29/785 257/192 |
| 2014/0231924 A1* | 8/2014 | Kuo ....................... H01L 29/785 257/401 |
| 2015/0144999 A1* | 5/2015 | Ching ................. H01L 29/7851 257/190 |

FOREIGN PATENT DOCUMENTS

WO    2009145798 A2    12/2009

\* cited by examiner

*Primary Examiner* — Matthew Landau
*Assistant Examiner* — Igwe U Anya
(74) *Attorney, Agent, or Firm* — Scully, Scott, Murphy & Presser, P.C.

(57) ABSTRACT

After formation of gate structures over semiconductor fins and prior to formation of raised active regions, a directional ion beam is employed to form a dielectric material portion on end walls of semiconductor fins that are perpendicular to the lengthwise direction of the semiconductor fins. The angle of the directional ion beam is selected to be with a vertical plane including the lengthwise direction of the semiconductor fins, thereby avoiding formation of the dielectric material portion on lengthwise sidewalls of the semiconductor fins. Selective epitaxy of semiconductor material is performed to grow raised active regions from sidewall surfaces of the semiconductor fins. Optionally, horizontal portions of the dielectric material portion may be removed prior to the selective epitaxy process. Further, the dielectric material portion may optionally be removed after the selective epitaxy process.

13 Claims, 23 Drawing Sheets

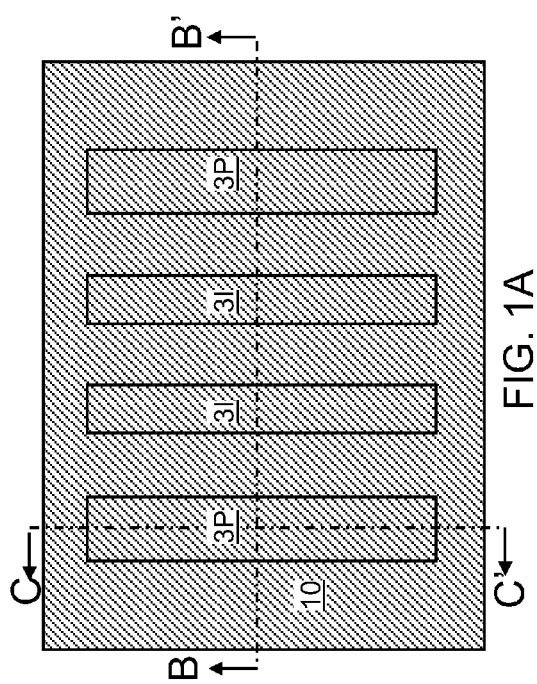
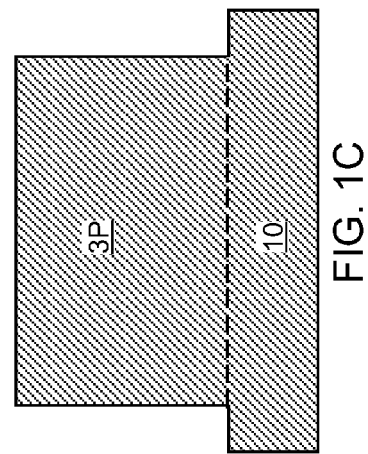
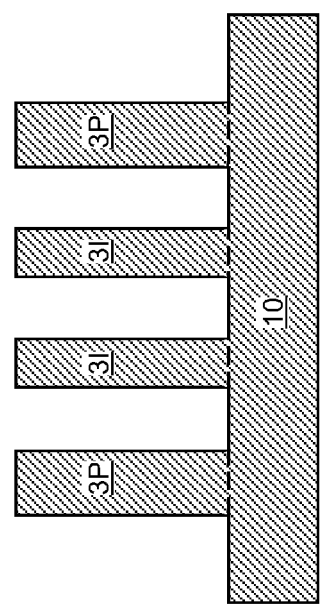
FIG. 1A
FIG. 1B
FIG. 1C

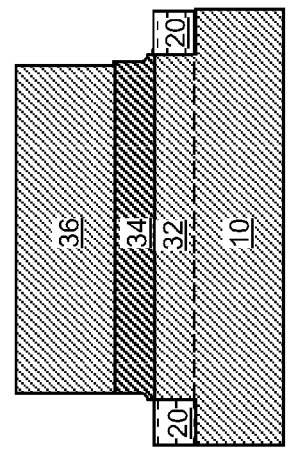
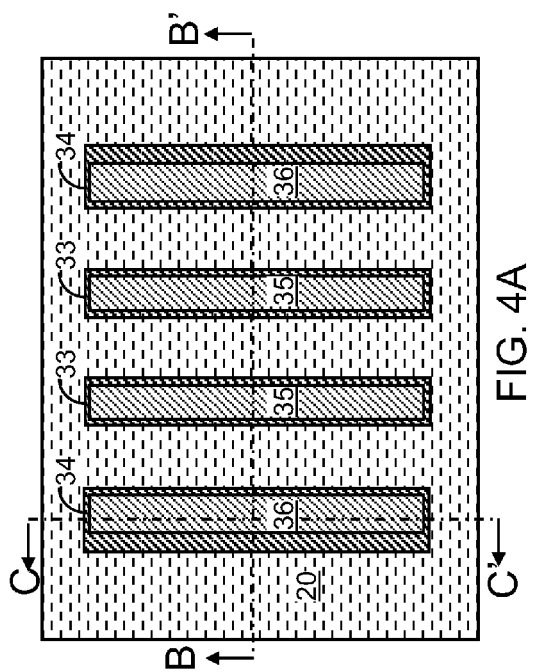
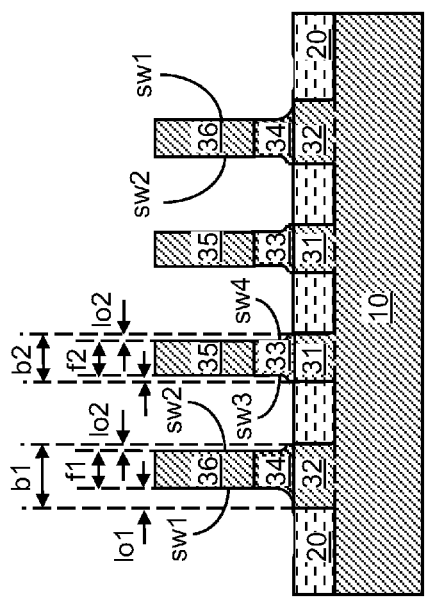

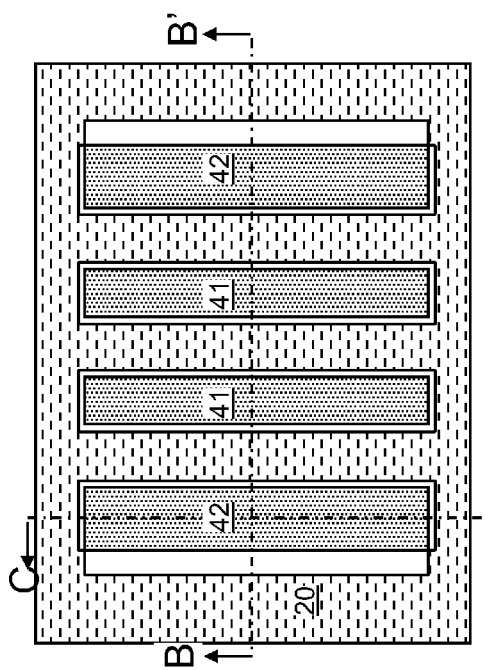
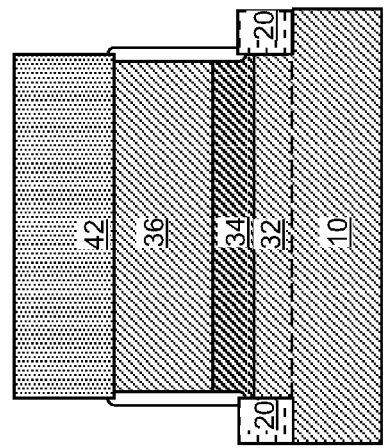
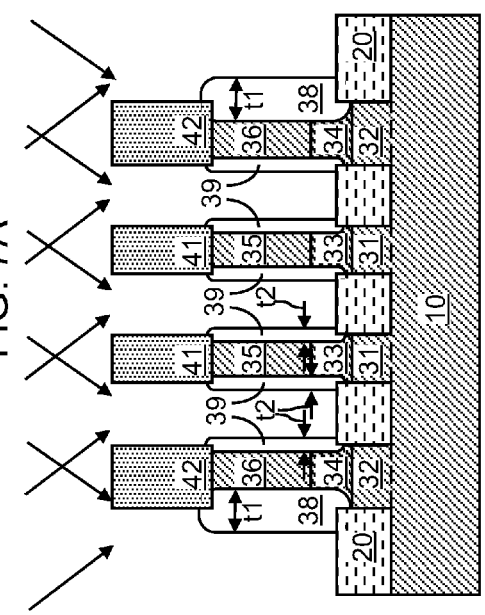
FIG. 7A
FIG. 7B
FIG. 7C

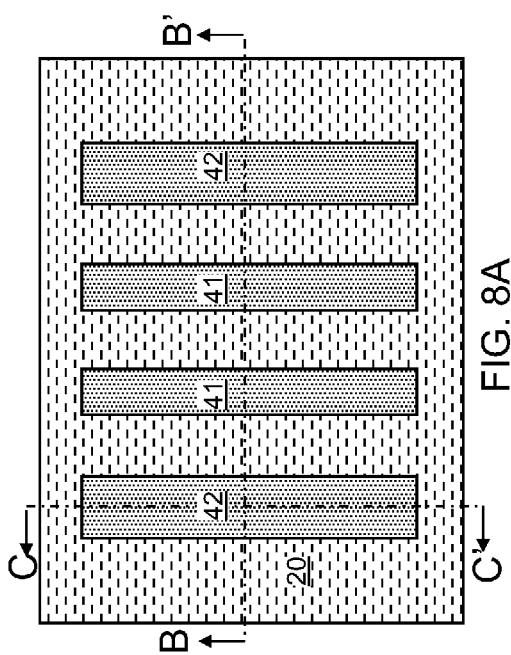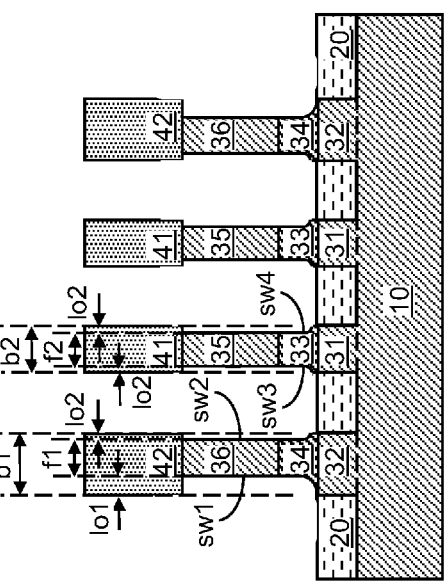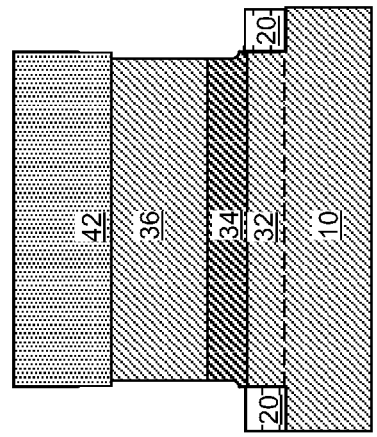

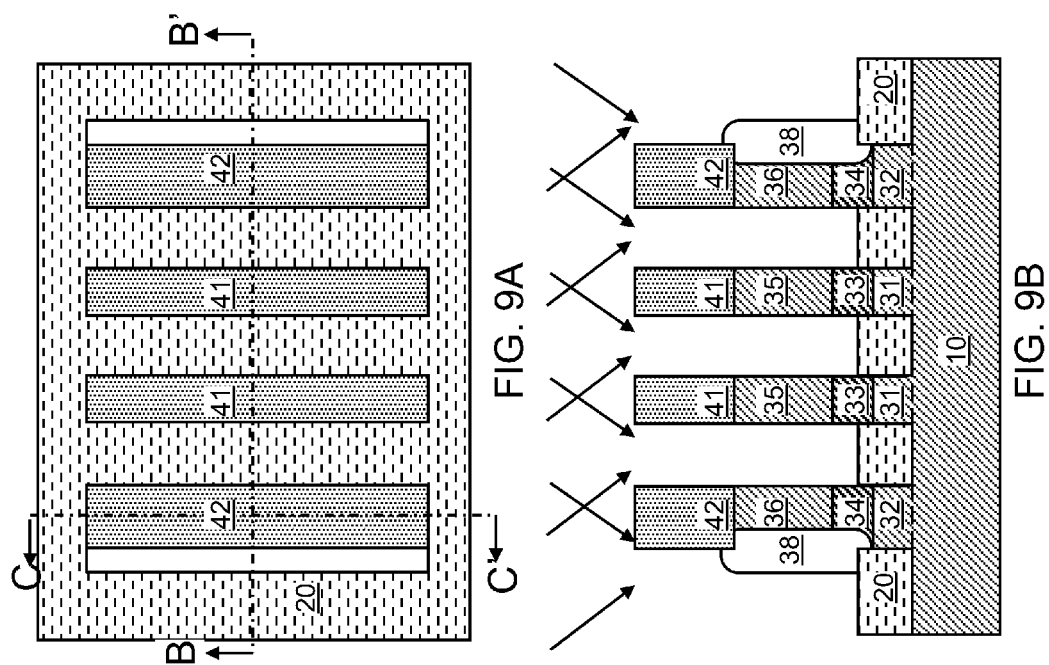

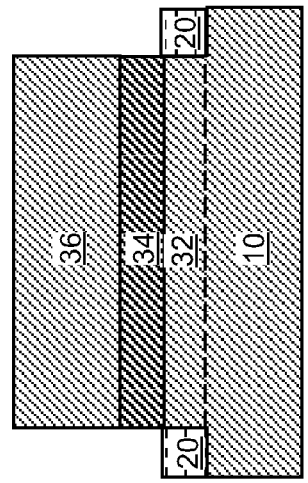
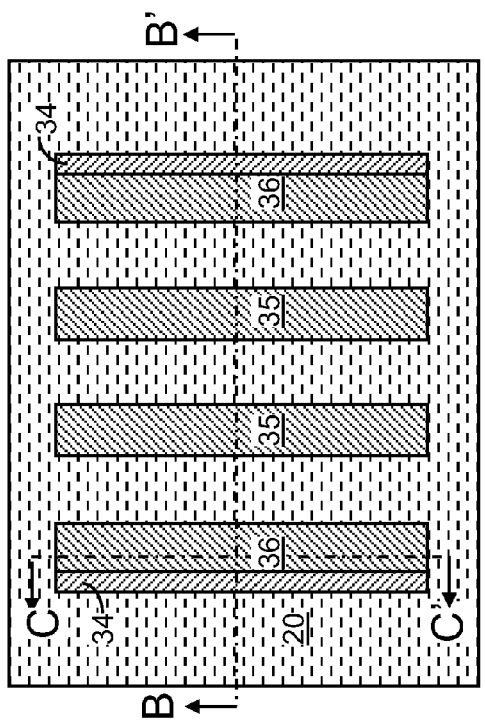
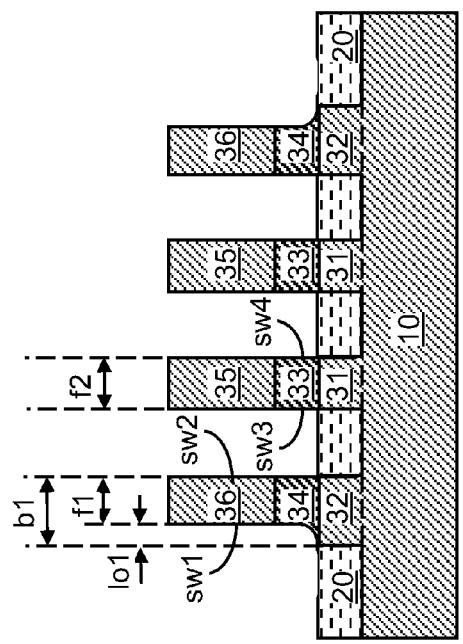
FIG. 11A
FIG. 11B
FIG. 11C

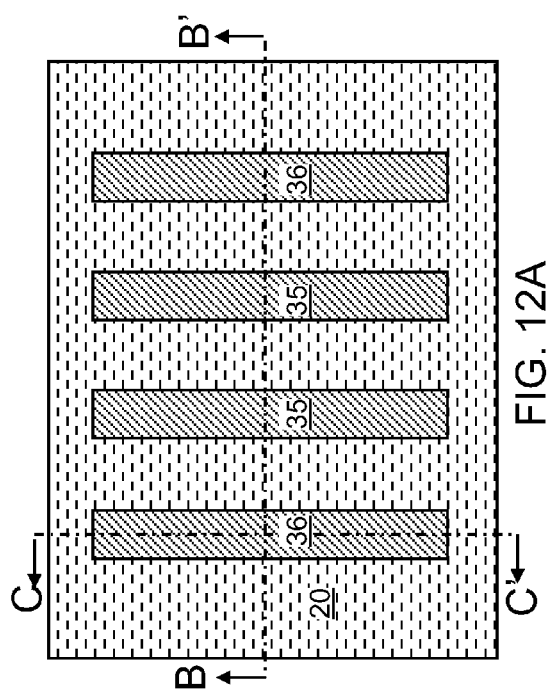
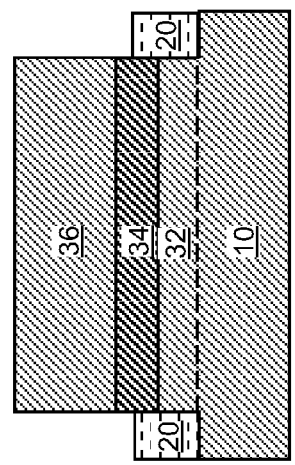
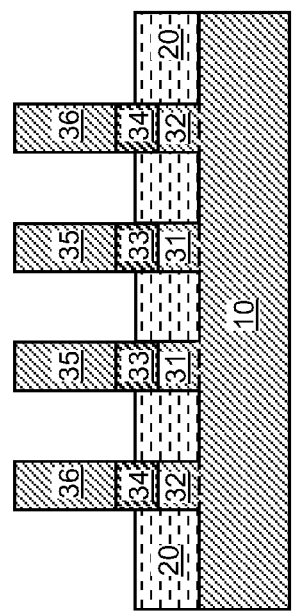

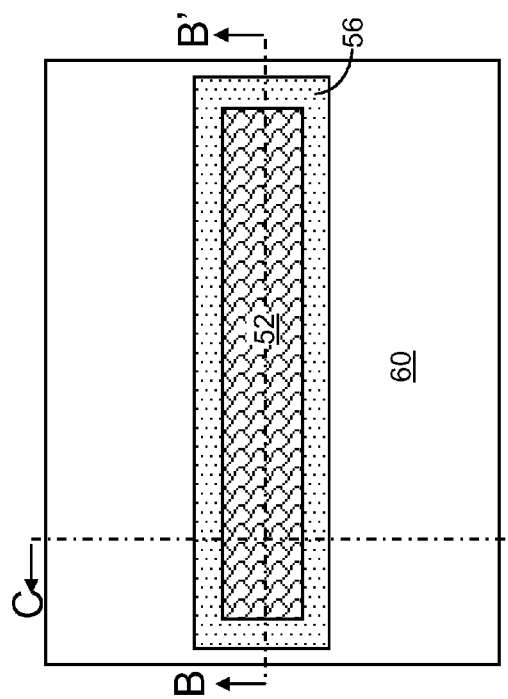
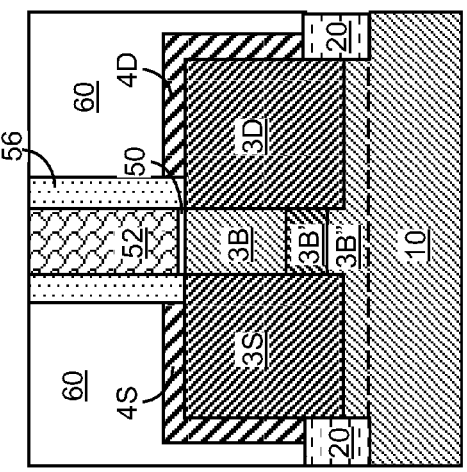
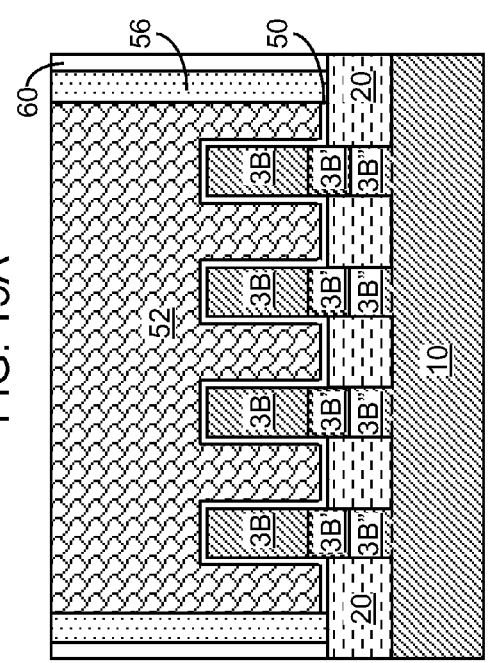
FIG. 15A
FIG. 15C
FIG. 15B

LOCAL THINNING OF SEMICONDUCTOR FINS

BACKGROUND

The present disclosure relates to a semiconductor structure, and particularly to a semiconductor structure including locally thinned semiconductor fins and a method for manufacturing the same.

Fin field effect transistors are widely employed in advanced semiconductor circuits for their superior performance over planar field effect transistors. Fin field effect transistors provide a high on-current per area and full depletion of a channel during operation. Typically, the width of the semiconductor fins employed for the field effect transistors is the minimum lithographically printable dimension, which is referred to as the critical dimension. Lithographic bias and etch bias that are introduced during lithographic patterning and pattern transfer can cause variations in the fin widths between semiconductor fins in a nested environment and semiconductor fins in an isolated environment. Thus, a method of selectively adjusting the widths of a group of semiconductor fins without affecting other semiconductor fins is desired.

Further, typical semiconductor processing flows provide semiconductor fins of identical height. This feature tends to quantize the on-current of fin field effect transistors. While the on-current of fin field effect transistors can be increased in multiples of the on-current of a fin field effect transistor employing a single fin, providing a fin field effect transistor having an on-current at a fractional multiple of the on-current of a fin field effect transistor employing a single fin is a challenge for conventional semiconductor processing sequences. Thus, a method is desired for providing field effect transistors having an on-current that is a non-integer multiple of the on-current of a fin field effect transistor employing a single fin.

SUMMARY

Implantation of oxygen atoms can be employed to convert an implanted portion of a semiconductor fin into a semiconductor oxide portion. Selection of the implanted portion of the semiconductor fin can be performed by angled implantation and/or a patterned mask layer. In one embodiment, a sidewall surface portion of a semiconductor fin can be converted into a semiconductor oxide portion by angled implantation of oxygen. Alternately or additionally, a top surface portion of a semiconductor fin can be converted into a semiconductor oxide portion by angled or non-angled implantation of oxygen. A plurality of semiconductor oxide portions can be formed. The at least one semiconductor oxide portions can be removed, for example, by a wet etch, and a laterally and/or vertically thinned semiconductor fin can be formed.

According to an aspect of the present disclosure, a method of forming a semiconductor structure is provided. A semiconductor fin is formed on a substrate. A planarization dielectric layer is formed over the semiconductor fin. A portion of a top surface of the semiconductor fin is physically exposed while another portion of the top surface of the semiconductor fin is covered with the planarization dielectric layer. A surface portion of the semiconductor fin is converted into a semiconductor oxide portion employing an oxygen cluster implantation process in which clusters of oxygen atoms are implanted into the surface portion of the semiconductor fin. The semiconductor oxide portion is removed to provide vertical thinning of the semiconductor fin.

According to another aspect of the present disclosure, another method of forming a semiconductor structure is provided. A plurality of semiconductor fins is formed on a substrate. The plurality of semiconductor fins includes two outermost semiconductor fins. Semiconductor oxide portions are formed on outermost sidewalls of the cluster employing an oxygen cluster implantation process in which clusters of oxygen atoms are implanted into physically exposed and unshaded surface portions of the two outermost semiconductor fins while inner sidewalls of the two outermost semiconductor fins are at least partially shaded. The two outermost semiconductor fins are laterally thinned by removing the semiconductor oxide portions.

According to yet another aspect of the present disclosure, a semiconductor structure is provided. The semiconductor structure includes a semiconductor fin located on a substrate. The semiconductor fin has a same semiconductor composition throughout and includes a body region having a different dopant composition than a fin source region and a fin drain region that are present within the semiconductor fin. A top surface of the body region is recessed relative to top surfaces of the fin source region and the fin drain region. A gate stack straddles the body region. Sidewalls of a gate dielectric within the gate stack contact sidewalls of the fin source region and the fin drain region.

According to still another aspect of the present disclosure, another semiconductor structure is provided. The semiconductor structure includes a semiconductor fin, which is located on a substrate and includes a first sidewall and a second sidewall. The first and second sidewalls extend along a lengthwise direction of the semiconductor fin. A planar upper portion of the first sidewall is contained within a first planar vertical plane, a planar upper portion of the second sidewall is contained within a second planar vertical plane that is parallel to the first planar vertical plane. A portion of the first sidewall includes a curved surface that protrudes outward from the first vertical plane by a distance that is greater than a maximum of any lateral deviation of the second sidewall from the second planar vertical plane.

BRIEF DESCRIPTION OF SEVERAL VIEWS OF THE DRAWINGS

FIG. 1A is a top-down view of a first exemplary semiconductor structure after formation of semiconductor fins and a shallow trench isolation layer according to a first embodiment of the present disclosure.

FIG. 1B is a vertical cross-sectional view of the first exemplary structure along the vertical plane B-B' in FIG. 1A.

FIG. 1C is a vertical cross-sectional view of the first exemplary structure along the vertical plane C-C' in FIG. 1A.

FIG. 4A is a top-down view of the first exemplary semiconductor structure after removal of the semiconductor oxide portions according to the first embodiment of the present disclosure.

FIG. 4B is a vertical cross-sectional view of the first exemplary structure along the vertical plane B-B' in FIG. 4A.

FIG. 4C is a vertical cross-sectional view of the first exemplary structure along the vertical plane C-C' in FIG. 4A.

FIG. 7A is a top-down view of the second exemplary semiconductor structure after angled implantation of oxygen clusters and formation of semiconductor oxide portions according to the second embodiment of the present disclosure.

FIG. 7B is a vertical cross-sectional view of the second exemplary structure along the vertical plane B-B' in FIG. 7A.

FIG. 7C is a vertical cross-sectional view of the second exemplary structure along the vertical plane C-C' in FIG. 7A.

FIG. 8A is a top-down view of the second exemplary semiconductor structure after removal of the semiconductor oxide portions according to the second embodiment of the present disclosure.

FIG. 8B is a vertical cross-sectional view of the second exemplary structure along the vertical plane B-B' in FIG. 8A.

FIG. 8C is a vertical cross-sectional view of the second exemplary structure along the vertical plane C-C' in FIG. 8A.

FIG. 9A is a top-down view of a third exemplary semiconductor structure after angled implantation of oxygen clusters and formation of semiconductor oxide portions according to the third embodiment of the present disclosure.

FIG. 9B is a vertical cross-sectional view of the third exemplary structure along the vertical plane B-B' in FIG. 9A.

FIG. 9C is a vertical cross-sectional view of the third exemplary structure along the vertical plane C-C' in FIG. 9A.

FIG. 11A is a top-down view of the third exemplary semiconductor structure after removal of the fin cap structures according to the third embodiment of the present disclosure.

FIG. 11B is a vertical cross-sectional view of the third exemplary structure along the vertical plane B-B' in FIG. 11A.

FIG. 11C is a vertical cross-sectional view of the third exemplary structure along the vertical plane C-C' in FIG. 11A.

FIG. 12A is a top-down view of a fourth exemplary semiconductor structure after formation of semiconductor fins and punchthrough doping layers according to the fourth embodiment of the present disclosure.

FIG. 12B is a vertical cross-sectional view of the fourth exemplary structure along the vertical plane B-B' in FIG. 12A.

FIG. 12C is a vertical cross-sectional view of the fourth exemplary structure along the vertical plane C-C' in FIG. 12A.

FIG. 15A is a top-down view of the fourth exemplary semiconductor structure after formation of a planarization dielectric layer according to the fourth embodiment of the present disclosure.

FIG. 15B is a vertical cross-sectional view of the fourth exemplary structure along the vertical plane B-B' in FIG. 15A.

FIG. 15C is a vertical cross-sectional view of the fourth exemplary structure along the vertical plane C-C' in FIG. 15A.

DETAILED DESCRIPTION

Figure 2C:
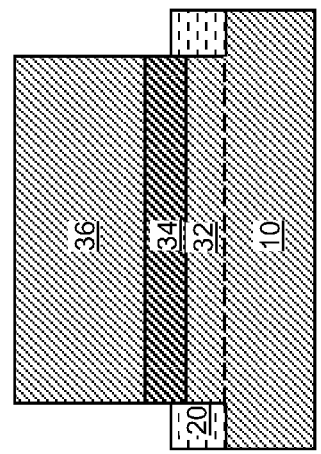
FIG. 2C is a vertical cross-sectional view of the first exemplary structure along the vertical plane C-C' in FIG. 2A.

As stated above, the present disclosure relates to a semiconductor structure including locally thinned semiconductor fins and a method for manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A-1C, a first exemplary semiconductor structure according to a first embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The upper portion of the semiconductor substrate can be patterned, by a combination of lithographic methods and an anisotropic etch, to form a plurality of semiconductor fins (3P, 3I). The plurality of semiconductor fins (3P, 3I) can include two outermost semiconductor fins 3P and at least one nested semiconductor fin 3I located between the two outermost semiconductor fins 3P.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin. As used herein, an "outermost semiconductor fin" refers to a semiconductor fin within a plurality of semiconductor fins that is located at an outermost location. As used herein, a "nested semiconductor fin" refers to a semiconductor fin within a plurality of semiconductor fins that is located between the two outermost semiconductor fins of the plurality of semiconductor fins.

For example, a photoresist layer (not shown) can be applied over the top surface of the semiconductor substrate and lithographically patterned to mask portions of the semiconductor substrate in which the plurality of semiconductor fins (3P, 3I) is subsequently formed. The pattern in the photoresist layer can be transferred into the upper portion of the semiconductor substrate to form the plurality of semiconductor fins (3P, 3I). If the semiconductor substrate is a bulk substrate, the remaining portion of the semiconductor substrate underlying the plurality of semiconductor fins (3P, 3I) is herein referred to as a semiconductor material layer 10. In this case, the semiconductor material layer 10 is a substrate on which the semiconductor fins (3P, 3I) are formed. The semiconductor material layer 10 functions as a substrate mechanically supporting the plurality of semiconductor fins (3P, 3I). The plurality of semiconductor fins (3P, 3I) and the semiconductor material layer 10 collectively constitute a contiguous semiconductor material portion. In one embodiment, the entirety of the contiguous semiconductor material portion can be single crystalline. Alternatively, if the semiconductor substrate is a semiconductor-on-insulator substrate, a vertical stack of a buried insulator layer and a handle substrate layer can be present underneath the plurality of semiconductor fins (3P, 3I) in lieu of the semiconductor material layer 10. In this case, the vertical stack of the buried insulator layer and the handle substrate layer is a substrate on which the semiconductor fins (3P, 3I) are formed.

The height of the semiconductor fins (3P, 3I) can be from 5 nm to 1,000 nm, although lesser and greater heights can also be employed. The plurality of semiconductor fins (3P, 3I) and the semiconductor material layer 10 can be doped with electrical dopants, i.e., p-type dopants or n-type dopants, or can be intrinsic. In one embodiment, the entirety of the plurality of semiconductor fins (3P, 3I) and the semiconductor material layer 10 can have a same type of doping, which is herein referred to as a first conductivity type.

Each semiconductor fin (3P or 3I) is laterally bound by a pair of lengthwise sidewalls and a pair of widthwise sidewalls. As used herein, a "lengthwise direction" of an element refers to a direction that is parallel to the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins (3P, 3I) can have a rectangular horizontal cross-sectional shape.

In one embodiment, lengthwise sidewalls of a semiconductor fin (3P or 3I) can be within a pair of vertical planes laterally spaced from each other by the width w of the semiconductor fin (3P or 3I). In one embodiment, the plurality of semiconductor fins (3P, 3I) can be within a two-dimensional array having a first pitch p1 along the lengthwise direction of the semiconductor fins (3P, 3I) and a second pitch p2 along the lengthwise direction of the semiconductor fins (3P, 3I). In one embodiment, widthwise sidewalls of a pair of semiconductor fins (3P, 3I) laterally spaced along the lengthwise direction can be laterally spaced from each other by a spacing s.

Figure 2A:
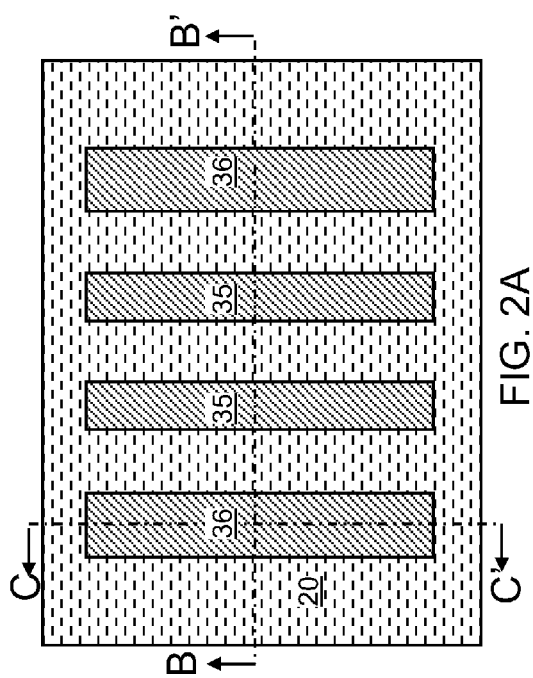
FIG. 2A is a top-down view of the first exemplary semiconductor structure after formation of punchthrough doping layers and a shallow trench isolation layer according to the first embodiment of the present disclosure.
Figure 2B:
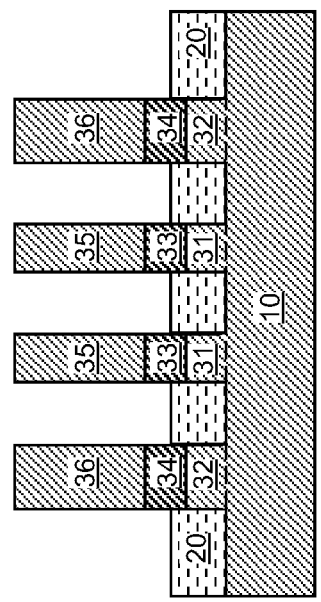
FIG. 2B is a vertical cross-sectional view of the first exemplary structure along the vertical plane B-B' in FIG. 2A.

Referring to FIGS. 2A-2C, a shallow trench isolation layer 20 can be formed among the plurality of semiconductor fins (3P, 3I). The shallow trench isolation layer 20 includes a dielectric material such as silicon oxide. The shallow trench isolation layer 20 can be formed by depositing a dielectric material over the semiconductor fins (3P, 3I) and the semiconductor material layer 10. The deposition of the dielectric material can be performed, for example, by chemical vapor deposition or spin coating. Excess portions of the deposited dielectric material can be removed from above the top surfaces of the semiconductor fins (3P, 3I), for example, by planarization (such as chemical mechanical planarization (CMP)). The shallow trench isolation layer 30 laterally surrounds the plurality of semiconductor fins (3P, 3I). The top surface of the shallow trench isolation layer 30 can be coplanar with the top surfaces of the plurality of semiconductor fins (3P, 3I).

Doped wells (not shown) may be formed in an upper portion of the semiconductor material layer 10 and underneath at least one semiconductor fin (3P or 3I; see FIGS. 1A-1C) as needed. Optionally, punchthrough doping layers (33, 34) having a doping of the opposite conductivity type as a semiconductor fin (3P or 3I) may be provided at a lower portion of the at least one semiconductor fin (3P or 3I) or a portion of the semiconductor material layer 10 that underlies the at least one semiconductor fin (3P or 3I). In general, various portions of the semiconductor material layer 10 and the semiconductor fins (3P, 3I) can be doped to provide suitable electrical isolation among the plurality of semiconductor fins (3P, 3I).

In an illustrative embodiment, each nested semiconductor fin can include a nested fin upper portion 35, a nested fin punchthrough doping layer 33, and an optional nested fin lower portion 31, and each outermost semiconductor fin can include an outermost fin upper portion 36, an outermost fin punchthrough doping layer 34, and an optional outermost fin lower portion 32.

Figure 3C:
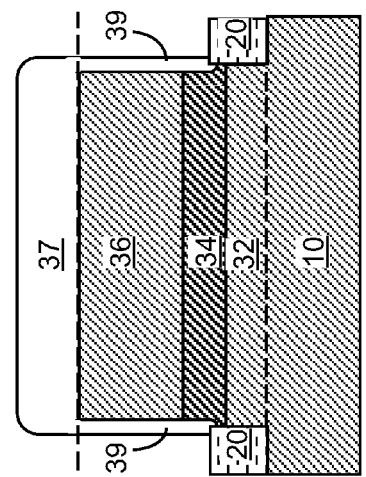
FIG. 3C is a vertical cross-sectional view of the first exemplary structure along the vertical plane C-C' in FIG. 3A.
Figure 3A:
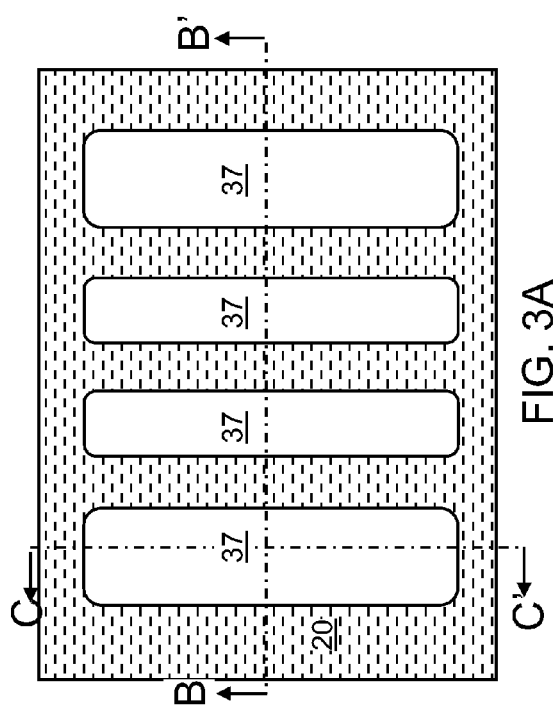
FIG. 3A is a top-down view of the first exemplary semiconductor structure after angled implantation of oxygen clusters and formation of semiconductor oxide portions according to the first embodiment of the present disclosure.
Figure 3B:
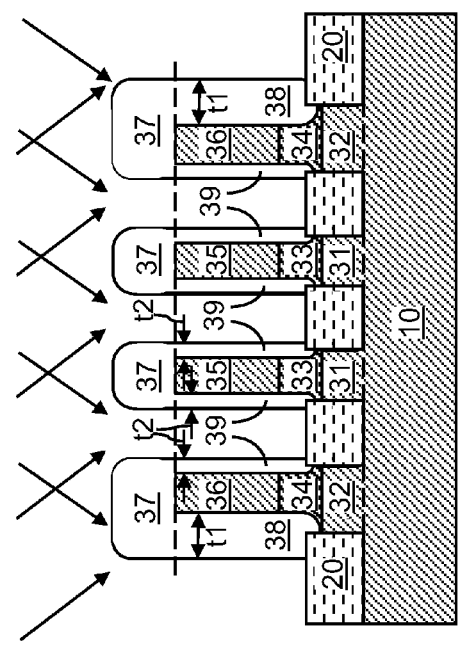
FIG. 3B is a vertical cross-sectional view of the first exemplary structure along the vertical plane B-B' in FIG. 3A.

Referring to FIGS. 3A-3C, oxygen clusters are implanted into surface portions of the semiconductor fins (31, 33, 35, 32, 34, 36) employing an angled oxygen cluster implantation process. During the angled oxygen cluster implantation process, clusters of oxygen atoms are implanted into physically exposed and unshaded surface portions of the semiconductor fins (31, 33, 35, 32, 34, 36). Sidewalls of the nested semiconductor fins (32, 34, 36) and inner sidewalls of the outermost semiconductor fins (32, 34, 36) are at least partially shaded during the oxygen cluster implantation process.

In one embodiment, directional ion beams of oxygen clusters can be employed during the angled oxygen cluster implantation process. In one embodiment, the directional ion beam implantation process can employ a gas cluster ion beam as known in the art. A gas cluster ion beam includes typically thousands of weakly bound atoms or molecules, which become ionized with a small amount of electrical charge that typically corresponds to the electrical charge of a single electron or several electrons. In one embodiment, the gas cluster ion beams can include clusters of oxygen atoms in which at least one hundred oxygen atoms are present per cluster.

In one embodiment, angled gas cluster ion beam can be employed, which includes a dielectric material or a cluster of a gas such as oxygen or nitrogen. In gas cluster ion beam implantation, a cluster of ions having a molecular weight in a range from 100 to 100,000 can be singly ionized, or ionized with a number of electrons that does not typically exceed 10. Such clusters of ions can travel at a low enough speed to be deposited on a surface of the target of the gas cluster ion beam, or to be implanted immediately beneath a surface of the target.

In one embodiment, the directional ion beam can include ionized clusters of oxygen atoms, which are implanted through surfaces of the semiconductor fins (31, 33, 35, 32, 34, 36) that are parallel to the lengthwise direction of the semiconductor fins (31, 33, 35, 32, 34, 36) to form various semiconductor oxide portions (37, 38, 39). In this case, the semiconductor oxide portions (37, 38, 39) include a semiconductor oxide that is formed by the combination of the implanted oxygen atoms from the gas cluster ion beam and the semiconductor material in the semiconductor fins (31, 33, 35, 32, 34, 36), and by deionization of the combined material. For example, the directional ion beam can include ions of a cluster of oxygen atoms, and the semiconductor oxide portions (37, 38, 39) can be formed by conversion of surface portions of the semiconductor fins (31, 33, 35, 32, 34, 36) into a semiconductor oxide material. In one embodiment, the directional ion beam can include oxygen and the semiconductor oxide portions (37, 38, 39) can include silicon oxide.

In one embodiment, the directional ion beam can be angled relative to the vertical direction perpendicular to the top surfaces of the semiconductor fins (31, 33, 35, 32, 34, 36) as illustrated in FIG. 3B. In one embodiment, the directional ion beam implantation process can be performed in two steps. In the first step, the direction of the directional ion beam be selected that a first unit vector representing the direction of the directional ion beam includes a downward vertical component and a horizontal component within the plane of the widthwise direction of the semiconductor fins (31, 33, 35, 32, 34, 36). In the second step, the direction of the directional ion beam can be selected that a second unit vector representing the direction of the directional ion beam includes the same downward vertical component as the first unit vector, and a horizontal component that is the opposite of the horizontal component of the first unit vector.

Thus, the first unit vector and the second unit vector are within a vertical plane including the width direction of the semiconductor fins (31, 33, 35, 32, 34, 36), which is perpendicular to the lengthwise direction of the semiconductor fins (31, 33, 35, 32, 34, 36). Optionally, a third step in which the direction of the directional ion beam is along a downward vertical direction may be added prior to the first step, between the first step and the second step, or after the second step. Thus, the beam direction is contained within a vertical plane perpendicular to the lengthwise sidewalls of the semiconductor fins (31, 33, 35, 32, 34, 36) throughout each step of the directional ion beam process. All beam directions during the directional ion beam process can be contained within a vertical plane perpendicular to the lengthwise sidewalls of the semiconductor fins (31, 33, 35, 32, 34, 36).

The angle between the first unit vector and the vertical direction can be in a range from 15 degrees to 80 degrees, although lesser and greater angles can also be employed. The angle between the second unit vector and the vertical direction can be in a range from 15 degrees to 80 degrees, although lesser and greater angles can also be employed. The angle between the first unit vector and the vertical direction can have the same magnitude as the angle between the second unit vector and the vertical direction.

Methods of generating a gas cluster ion beam are known in the art, and can be found, for example, in U.S. Patent Application Publication No. 2002/0014407 to Allen et al. and U.S. Patent Application Publication No. 2001/0010835 to Akizuki et al.

A first semiconductor oxide portion 38 can be formed on each outermost sidewall of the outermost semiconductor fins (32, 34, 36). The outermost sidewalls of the two outermost semiconductor fins (32, 34, 36) are implanted with clusters of oxygen atoms while inner sidewalls of the two outermost semiconductor fins are at least partially shaded during the directional ion beam implantation process. The thickness of the first semiconductor oxide portions 38 can be uniform across the entirety of outermost sidewall surfaces of the outermost semiconductor fins (32, 34, 35), and is herein referred to as a first thickness t1. The first thickness t1 can be in a range from 1 nm to 20 nm, although lesser and greater first thicknesses t1 can also be employed.

Top semiconductor oxide portions 37 can be formed on each top surface of the outermost semiconductor fins (32, 34, 36) and on each top surface of the nested semiconductor fins (31, 33, 35) by conversion of top portions of the semiconductor fins (31, 33, 35, 32, 34, 36). The thickness of the top semiconductor oxide portions 37 may be greater than, the same as, or lesser than, the first thickness t1 depending on the angle of the ion beams during the angled ion beam implantation process.

Additional semiconductor oxide portions, which are herein referred to as second semiconductor oxide portions 39, can be formed on inner sidewalls of the two outermost semiconductor fins (32, 34, 46) and on the sidewalls of the nested semiconductor fins (31, 33, 35). The additional semiconductor oxide portions formed on the inner sidewalls of the two outermost semiconductor fins (32, 34, 46) and on the sidewalls of the nested semiconductor fins (31, 33, 35) are herein referred to as second semiconductor oxide portions 39. Further, the second semiconductor oxide portions 39 may be formed on widthwise sidewalls of the semiconductor fins (31, 33, 35, 32, 34, 36).

The formation of the second semiconductor oxide portions 39 can be due to imperfect shading of the ion clusters, angular spread of the ion clusters, and/or scatter of the ion clusters during the angled ion beam implantation process. The maximum thickness of the second semiconductor oxide portions 39 is herein referred to as a second thickness t2, which is less than the first thickness t1. Thus, the first semiconductor oxide portions 38 on the outermost sidewalls of the plurality of semiconductor fins (31, 33, 35, 32, 34, 36) have a greater thickness than the second semiconductor oxide portions 39. The second thickness t2 can be in a range from 0.1 nm to 10 nm, although lesser and greater second thicknesses t2 can also be employed.

A set including a first semiconductor oxide portion 38, second semiconductor oxide portions 39, and a top semiconductor oxide portion 37 can form a contiguous semiconductor oxide portion that overlies and laterally surrounds an outermost semiconductor fin (32, 34, 36). Another set including second semiconductor oxide portions 39 and a top semiconductor oxide portion 37 can form another contiguous semiconductor oxide portion that overlies and laterally surrounds at least one nested semiconductor fin (31, 33, 35).

Referring to FIGS. 4A-4C, the semiconductor oxide portions (37, 38, 39) can be subsequently removed by an etch, which can be an isotropic etch. In one embodiment, a wet etch that is selective to the semiconductor material of the semiconductor fins (31, 33, 35, 32, 34, 36) can be employed. For example, a wet etch employing hydrofluoric acid can be performed to remove the semiconductor oxide portions (37, 38, 39) selective to the semiconductor fins (31, 33, 35, 32, 34, 36).

The two outermost semiconductor fins (32, 34, 36) are laterally thinned by removing the semiconductor oxide portions (37, 38, 39). The first exemplary semiconductor structure includes a semiconductor fin, e.g., an outermost semiconductor fin (32, 34, 36) located on a substrate, e.g., the semiconductor material layer 10, and including a first sidewall sw1 and a second sidewall sw2. The first and second sidewalls (sw1, sw2) extend along the lengthwise direction of the semiconductor fin. A planar upper portion of the first sidewall sw1 is contained within a first planar vertical plane, and a planar upper portion of the second sidewall sw2 is contained within a second planar vertical plane that is parallel to the first planar vertical plane. Each of the first sidewall sw1 and the second sidewall sw2 can extend to the top surface of the substrate such as the top surface of the semiconductor material layer 10. A portion of the first sidewall sw1 includes a curved surface that protrudes outward from the first vertical plane by a distance that is greater than the maximum of any lateral deviation of the second sidewall sw2 from the second planar vertical plane.

In one embodiment, an outermost fin upper portion 36 can have the shape of a rectangular parallelepiped having a first fin top width f1. An underlying outermost fin lower portion 32 can have a first fin bottom width b1, which is greater than the first fin top width f1. The lateral offset distance between the vertical plane including the planar upper portion of the first sidewall sw1 and a vertical plane including the bottommost portion of the first sidewall sw1 is herein referred to as a first lateral offset distance lo1. The lateral offset distance between the vertical plane including the planar upper portion of the second sidewall sw2 and a vertical plane including the bottommost portion of the second sidewall sw2 is herein referred to as a second lateral offset distance lo2, which is less than the first lateral offset distance lo1.

The nested semiconductor fin (31, 33, 35) can have a pair of sidewalls that extend along the lengthwise direction of the nested semiconductor fin (31, 33, 35). The pair of sidewalls of the nested semiconductor fin (31, 33, 35) can include planar portions having a uniform width. In one embodiment, a nested fin upper portion 356 can have the shape of a rectangular parallelepiped having a second fin top width f2. An underlying nested fin lower portion 31 can have a second fin bottom width b2, which is greater than the second fin top width f2. Each nested semiconductor fin (31, 33, 35) can have a third sidewall sw3 and a fourth sidewall sw4. Each of the third sidewall sw3 and the fourth sidewall sw4 can extend to the top surface of the substrate such as the top surface of the semiconductor material layer 10. The lateral offset of an upper portion of the third sidewall sw3 relative to a lower portion of the third sidewall sw3 can be the same as the lateral offset of an upper portion of the fourth sidewall sw4 relative to a lower portion of the fourth sidewall sw4, and can be equal to (b2−b1)/2, and also can be the same as the second lateral offset distance lo2. The maximum lateral deviation of each of the pair of sidewalls of the nested semiconductor fin (31, 33, 35) can be the same as the maximum of any lateral deviations of the second sidewall sw2, which is the second lateral offset distance lo2.

In one embodiment, the curved surface in the first sidewall sw1 can be a concave surface having the same curvature along the lengthwise direction of the outermost semiconductor fin (32, 34, 36) on which the first sidewall sw1 is present. In one embodiment, each of the second, third, and third sidewalls (sw2, sw3, sw4) can include a concave surface having a lesser radius of curvature than the concave surface in the first sidewall sw1.

A gate stack (not shown) can be formed across the plurality of semiconductor fins (31, 33, 35, 32, 34, 36) after the two outermost semiconductor fins (32, 34, 36) are thinned. Methods known in the art may be employed to form field effect transistors employing the plurality of semiconductor fins (31, 33, 35, 32, 34, 36).

Figure 5A:
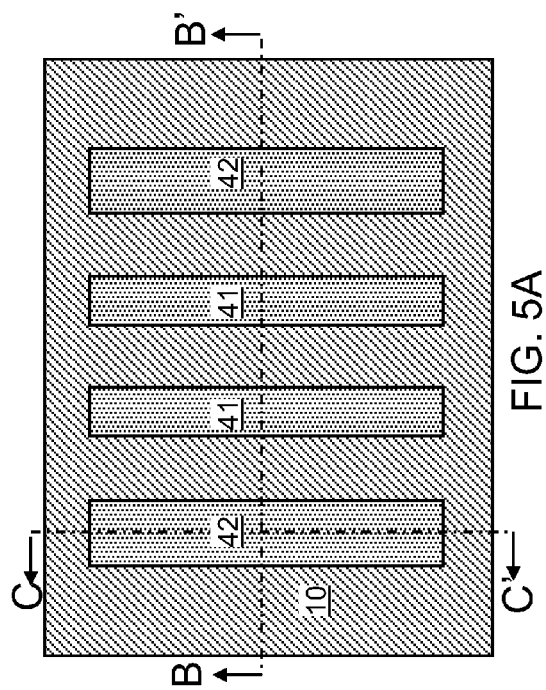
FIG. 5A is a top-down view of a second exemplary semiconductor structure after formation of stacks of a semiconductor fin and a fin cap structure and formation of a shallow trench isolation layer according to a second embodiment of the present disclosure.
Figure 5C:
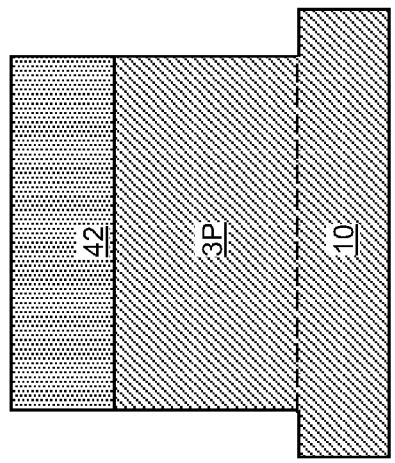
FIG. 5C is a vertical cross-sectional view of the second exemplary structure along the vertical plane C-C' in FIG. 5A.
Figure 5B:
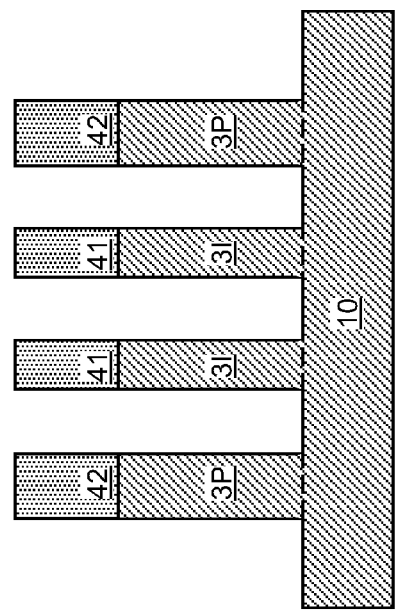
FIG. 5B is a vertical cross-sectional view of the second exemplary structure along the vertical plane B-B' in FIG. 5A.

Referring to FIGS. 5A-5C, a second exemplary semiconductor structure according to a second embodiment of the present disclosure can be derived from the first exemplary semiconductor structure by forming fin cap structures (41, 42) on top of the semiconductor fins (3P, 3I). Specifically, stacks of a semiconductor fin (3P or 3I) and a fin cap structure (41 or 42) are formed on a substrate such as a semiconductor material layer 10 and formation of a shallow trench isolation layer according to a second embodiment of the present disclosure. The fin cap structures (41, 42) include outermost fin cap structures 42 and nested fin cap structures 41. Each outermost fin cap structure 42 is formed on top of an outermost semiconductor fin 3P, and each nested fin cap structure 41 is formed on top of a nested semiconductor fin 3I. The second exemplary semiconductor structure can be formed, for example, by depositing a fin cap material layer (not shown) on a top surface of a semiconductor substrate prior to patterning the semiconductor fins (3P, 3I), and subsequently patterning the fin cap material layer and a top portion of the semiconductor substrate. Remaining portions of the fin cap material layer constitute the fin cap structures (41, 42). The fin cap structures (41, 42) can include a dielectric material such as silicon nitride or silicon oxide, or can include a metallic material such as a metallic nitride, a metallic carbide, an elemental metal, or an intermetallic alloy, or combinations of any of the foregoing.

Figure 6C:
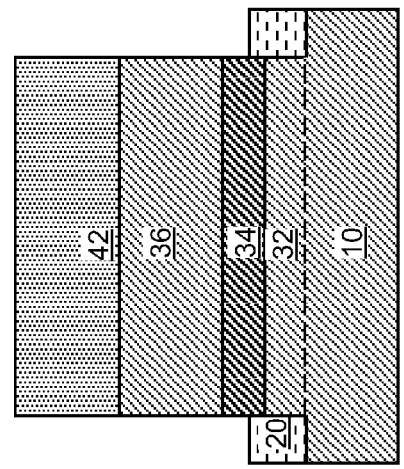
FIG. 6C is a vertical cross-sectional view of the second exemplary structure along the vertical plane C-C' in FIG. 6A.
Figure 6A:
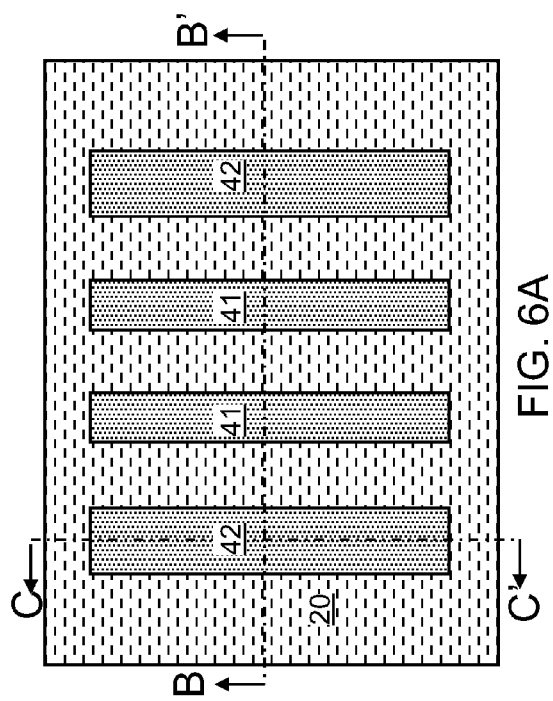
FIG. 6A is a top-down view of the second exemplary semiconductor structure after formation of punchthrough doping layers and a shallow trench isolation layer according to the second embodiment of the present disclosure.
Figure 6B:
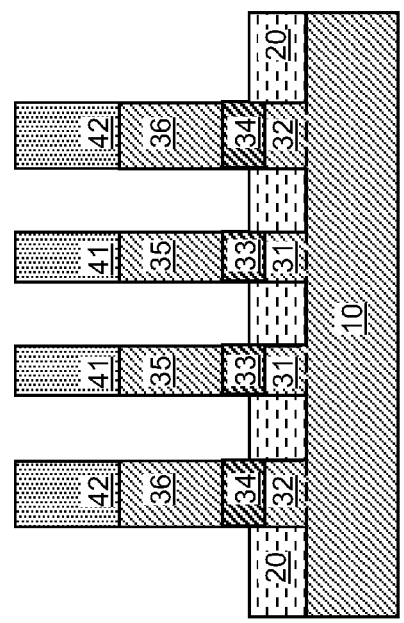
FIG. 6B is a vertical cross-sectional view of the second exemplary structure along the vertical plane B-B' in FIG. 6A.

Referring to FIGS. 6A-6C, punchthrough doping layers (33, 34) and a shallow trench isolation layer 20 can be formed employing the same method as in the first embodiment.

Referring to FIGS. 7A-7C, oxygen clusters are implanted into surface portions of the semiconductor fins (31, 33, 35, 32, 34, 36) employing an angled oxygen cluster implantation process in the same manner as in the first embodiment. During the angled oxygen cluster implantation process, clusters of oxygen atoms are implanted into physically exposed and unshaded surface portions of the semiconductor fins (31, 33, 35, 32, 34, 36). Sidewalls of the nested semiconductor fins (32, 34, 36) and inner sidewalls of the outermost semiconductor fins (32, 34, 36) are at least partially shaded during the oxygen cluster implantation process. In addition, the fin cap structures (41, 42) provide shading of the clusters of oxygen atoms during the oxygen cluster implantation process.

A first semiconductor oxide portion 38 can be formed on each outermost sidewall of the outermost semiconductor fins (32, 34, 36). The outermost sidewalls of the two outermost semiconductor fins (32, 34, 36) are implanted with clusters of oxygen atoms while inner sidewalls of the two outermost semiconductor fins are at least partially shaded during the directional ion beam implantation process. The thickness of the first semiconductor oxide portions 38 can be uniform across the entirety of outermost sidewall surfaces of the outermost semiconductor fins (32, 34, 35), and is herein referred to as a first thickness t1. The first thickness t1 can be in a range from 1 nm to 20 nm, although lesser and greater first thicknesses t1 can also be employed.

Additional semiconductor oxide portions, which are herein referred to as second semiconductor oxide portions 39, can be formed on inner sidewalls of the two outermost semiconductor fins (32, 34, 46) and on the sidewalls of the nested semiconductor fins (31, 33, 35). The additional semiconductor oxide portions formed on the inner sidewalls of the two outermost semiconductor fins (32, 34, 46) and on the sidewalls of the nested semiconductor fins (31, 33, 35) are herein referred to as second semiconductor oxide portions 39. Further, the second semiconductor oxide portions 39 may be formed on widthwise sidewalls of the semiconductor fins (31, 33, 35, 32, 34, 36).

The formation of the second semiconductor oxide portions 39 can be due to imperfect shading of the ion clusters, angular spread of the ion clusters, and/or scatter of the ion clusters during the angled ion beam implantation process.

The maximum thickness of the second semiconductor oxide portions 39 is herein referred to as a second thickness t2, which is less than the first thickness t1. Thus, the first semiconductor oxide portions 38 on the outermost sidewalls of the plurality of semiconductor fins (31, 33, 35, 32, 34, 36) have a greater thickness than the second semiconductor oxide portions 39. The second thickness t2 can be in a range from 0.1 nm to 10 nm, although lesser and greater second thicknesses t2 can also be employed.

Referring to FIGS. 8A-8C, the semiconductor oxide portions (38, 39) can be subsequently removed by an etch, which can be an isotropic etch. In one embodiment, a wet etch that is selective to the semiconductor material of the semiconductor fins (31, 33, 35, 32, 34, 36) can be employed. For example, a wet etch employing hydrofluoric acid can be performed to remove the semiconductor oxide portions (38, 39) selective to the semiconductor fins (31, 33, 35, 32, 34, 36).

The two outermost semiconductor fins (32, 34, 36) are laterally thinned by removing the semiconductor oxide portions (37, 38, 39). The second exemplary semiconductor structure includes a semiconductor fin, e.g., an outermost semiconductor fin (32, 34, 36) located on a substrate, e.g., the semiconductor material layer 10, and including a first sidewall sw1 and a second sidewall sw2. The first and second sidewalls (sw1, sw2) extend along the lengthwise direction of the semiconductor fin. A planar upper portion of the first sidewall sw1 is contained within a first planar vertical plane, and a planar upper portion of the second sidewall sw2 is contained within a second planar vertical plane that is parallel to the first planar vertical plane. Each of the first sidewall sw1 and the second sidewall sw2 can extend to the top surface of the substrate such as the top surface of the semiconductor material layer 10. A portion of the first sidewall sw1 includes a curved surface that protrudes outward from the first vertical plane by a distance that is greater than the maximum of any lateral deviation of the second sidewall sw2 from the second planar vertical plane.

In one embodiment, an outermost fin upper portion 36 can have the shape of a rectangular parallelepiped having a first fin top width f1. An underlying outermost fin lower portion 32 can have a first fin bottom width b1, which is greater than the first fin top width f1. The lateral offset distance between the vertical plane including the planar upper portion of the first sidewall sw1 and a vertical plane including the bottommost portion of the first sidewall sw1 is herein referred to as a first lateral offset distance lo1. The lateral offset distance between the vertical plane including the planar upper portion of the second sidewall sw2 and a vertical plane including the bottommost portion of the second sidewall sw2 is herein referred to as a second lateral offset distance lo2, which is less than the first lateral offset distance lo1.

The nested semiconductor fin (31, 33, 35) can have a pair of sidewalls that extend along the lengthwise direction of the nested semiconductor fin (31, 33, 35). The pair of sidewalls of the nested semiconductor fin (31, 33, 35) can include planar portions having a uniform width. In one embodiment, a nested fin upper portion 356 can have the shape of a rectangular parallelepiped having a second fin top width f2. An underlying nested fin lower portion 31 can have a second fin bottom width b2, which is greater than the second fin top width f2. Each nested semiconductor fin (31, 33, 35) can have a third sidewall sw3 and a fourth sidewall sw4. Each of the third sidewall sw3 and the fourth sidewall sw4 can extend to the top surface of the substrate such as the top surface of the semiconductor material layer 10. The lateral offset of an upper portion of the third sidewall sw3 relative to a lower portion of the third sidewall sw3 can be the same as the lateral offset of an upper portion of the fourth sidewall sw4 relative to a lower portion of the fourth sidewall sw4, and can be equal to (b2−b1)/2, and also can be the same as the second lateral offset distance lo2. The maximum lateral deviation of each of the pair of sidewalls of the nested semiconductor fin (31, 33, 35) can be the same as the maximum of any lateral deviations of the second sidewall sw2, which is the second lateral offset distance lo2.

In one embodiment, the curved surface in the first sidewall sw1 can be a concave surface having the same curvature along the lengthwise direction of the outermost semiconductor fin (32, 34, 36) on which the first sidewall sw1 is present. In one embodiment, each of the second, third, and third sidewalls (sw2, sw3, sw4) can include a concave surface having a lesser radius of curvature than the concave surface in the first sidewall sw1.

A gate stack (not shown) can be formed across the plurality of semiconductor fins (31, 33, 35, 32, 34, 36) after the two outermost semiconductor fins (32, 34, 36) are thinned. Methods known in the art may be employed to form field effect transistors employing the plurality of semiconductor fins (31, 33, 35, 32, 34, 36).

Subsequently, the fin cap structures (41, 42) can be removed selective to the semiconductor fins (31, 33, 35, 32, 34, 36) and the shallow trench isolation layer 20 by an etch. The etch can be an isotropic etch such as a wet etch. For example, if the fin cap structures (41, 42) include silicon nitride, a wet etch employing hot phosphoric acid can be employed to remove the fin cap structures (41. 42). The second exemplary semiconductor structure after removal of the fin cap structures (41, 42) can be the same as the first exemplary semiconductor structure illustrated in FIGS. 4A-4C.

Referring to FIGS. 9A-9C, a third exemplary semiconductor structure according to a third embodiment of the present disclosure can be derived from the second exemplary semiconductor structure of FIGS. 6A-6C by performing the processing steps of FIGS. 7A-7C with modifications to the beam angles for the angled implantation of oxygen. In the third exemplary semiconductor structure. Inner sidewalls of the outermost semiconductor fins (32, 34, 36) and sidewalls of the at least one nested semiconductor fin (31, 33, 35) are fully shaded during the oxygen cluster implantation process so that no semiconductor oxide portion is formed directly on the inner sidewalls of the outermost semiconductor fins (32, 34, 36) and the sidewalls of the at least one nested semiconductor fin (31, 33, 35). Only the first semiconductor oxide portions 38 are formed on the outermost sidewalls of the outermost semiconductor fins (32, 34, 36).

Figure 10A:
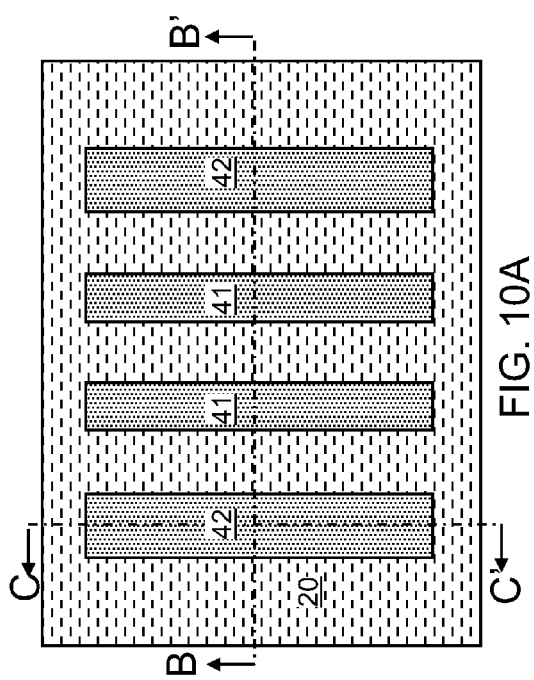
FIG. 10A is a top-down view of the third exemplary semiconductor structure after removal of the semiconductor oxide portions according to the third embodiment of the present disclosure.
Figure 10C:
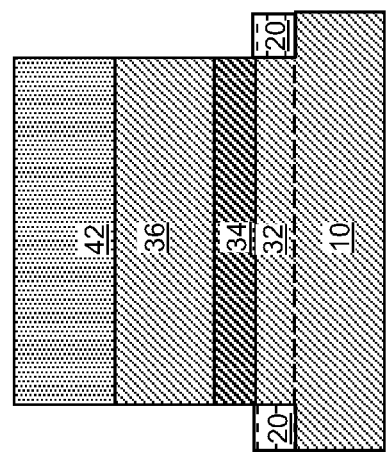
FIG. 10C is a vertical cross-sectional view of the third exemplary structure along the vertical plane C-C' in FIG. 10A.
Figure 10B:
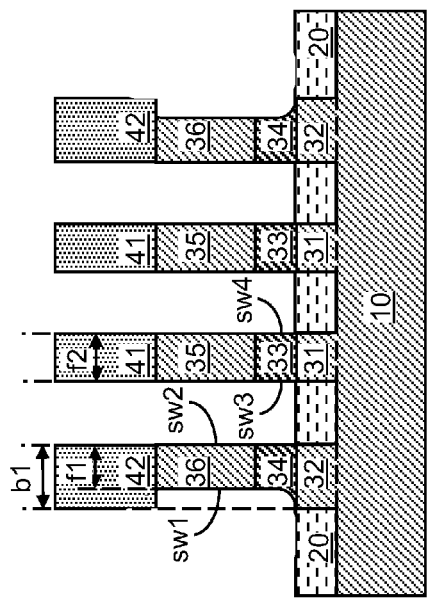
FIG. 10B is a vertical cross-sectional view of the third exemplary structure along the vertical plane B-B' in FIG. 10A.

Referring to FIGS. 10A-10C, the processing steps of FIGS. 4A-4C or FIGS. 8A-8C are performed to remove the first semiconductor oxide portions 38.

Referring to FIGS. 11A-11C, the fin cap structures (41, 42) can be removed selective to the semiconductor fins (31, 33, 35, 32, 34, 36) and the shallow trench isolation layer 20 by an etch. The etch can be an isotropic etch such as a wet etch. For example, if the fin cap structures (41, 42) include silicon nitride, a wet etch employing hot phosphoric acid can be employed to remove the fin cap structures (41. 42).

The two outermost semiconductor fins (32, 34, 36) are laterally thinned by removing the semiconductor oxide portions (37, 38, 39). The third exemplary semiconductor structure includes a semiconductor fin, e.g., an outermost semiconductor fin (32, 34, 36) located on a substrate, e.g., the semiconductor material layer 10, and including a first sidewall sw1 and a second sidewall sw2. The first and second sidewalls (sw1, sw2) extend along the lengthwise direction of the semiconductor fin. A planar upper portion of the first sidewall sw1 is contained within a first planar vertical plane, and the entirety of the second sidewall sw2 can be contained within a second planar vertical plane that is parallel to the first planar vertical plane. Each of the first sidewall sw1 and the second sidewall sw2 can extend to the top surface of the substrate such as the top surface of the semiconductor material layer 10. A portion of the first sidewall sw1 includes a curved surface that protrudes outward from the first vertical plane by a distance that is greater than the maximum of any lateral deviation of the second sidewall sw2 from the second planar vertical plane, which can be zero.

In one embodiment, an outermost fin upper portion 36 can have the shape of a rectangular parallelepiped having a first fin top width f1. An underlying outermost fin lower portion 32 can have a first fin bottom width b1, which is greater than the first fin top width f1. The lateral offset distance between the vertical plane including the planar upper portion of the first sidewall sw1 and a vertical plane including the bottommost portion of the first sidewall sw1 is herein referred to as a first lateral offset distance lo1. The nested semiconductor fin (31, 33, 35) can have a pair of sidewalls that extend along the lengthwise direction of the nested semiconductor fin (31, 33, 35). Each nested semiconductor fin (31, 33, 35) can have a uniform width throughout the entirety thereof.

In one embodiment, the curved surface in the first sidewall sw1 can be a concave surface having the same curvature along the lengthwise direction of the outermost semiconductor fin (32, 34, 36) on which the first sidewall sw1 is present. A gate stack (not shown) can be formed across the plurality of semiconductor fins (31, 33, 35, 32, 34, 36) after the two outermost semiconductor fins (32, 34, 36) are thinned. Methods known in the art may be employed to form field effect transistors employing the plurality of semiconductor fins (31, 33, 35, 32, 34, 36).

Referring to FIGS. 12A-12C, a fourth exemplary semiconductor structure according to the fourth embodiment of the present disclosure can be the first exemplary semiconductor structure as provided after the processing steps of FIGS. 2A-2C, the first exemplary semiconductor structure or the second exemplary semiconductor structure as provided after the processing steps of FIGS. 4A-4C, or the third exemplary semiconductor structure as provided after the processing steps of FIGS. 11A-11C.

Figure 13A:
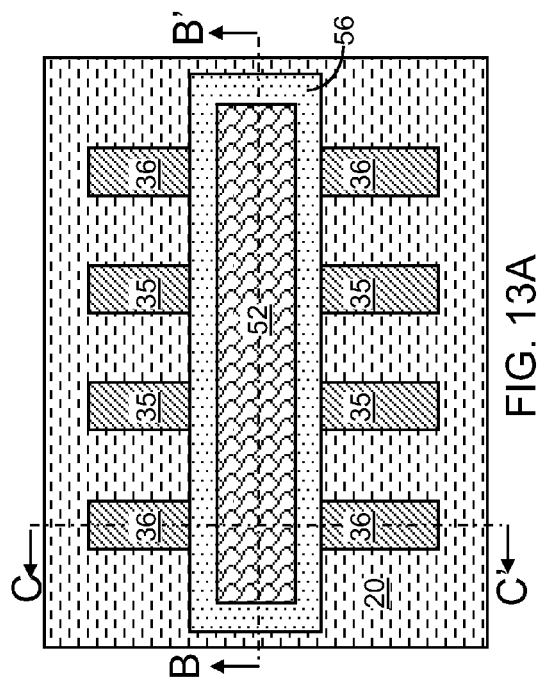
FIG. 13A is a top-down view of the fourth exemplary semiconductor structure after formation of a disposable gate stack and a gate spacer according to the fourth embodiment of the present disclosure.
Figure 13C:
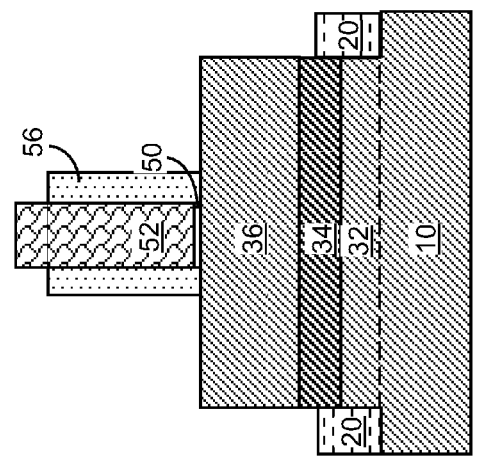
FIG. 13C is a vertical cross-sectional view of the fourth exemplary structure along the vertical plane C-C' in FIG. 13A.
Figure 13B:
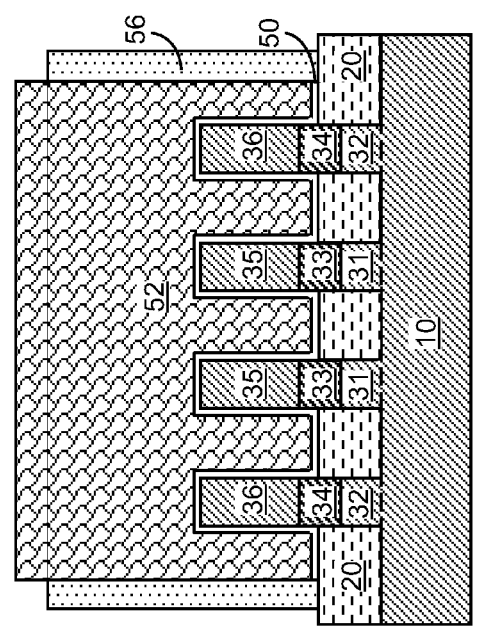
FIG. 13B is a vertical cross-sectional view of the fourth exemplary structure along the vertical plane B-B' in FIG. 13A.

Referring to FIGS. 13A-13C, at least one disposable gate level layer can be deposited and patterned to form a disposable gate stack (50, 52) that straddles the plurality of semiconductor fins (31, 33, 35, 32, 34, 36). The at least one disposable gate level layer can include, for example, a disposable gate dielectric layer and a disposable gate material layer. The patterned portion of the at least one disposable gate level layer can include, for example, a disposable gate dielectric 50 and a disposable gate material portion 52. The disposable gate stack (50, 52) is formed over regions of the semiconductor fins (31, 33, 35, 32, 34, 36) in which body regions of field effect transistors are to be formed.

A gate spacer 56 including a dielectric material can be formed around the disposable gate stack (50, 52). The gate spacer 56 can be formed, for example, by depositing a conformal dielectric material layer and anisotropically etching the conformal dielectric material layer. The gate spacer 56 can include a dielectric material such as silicon oxide, silicon nitride, or silicon oxynitride.

Figure 14A:
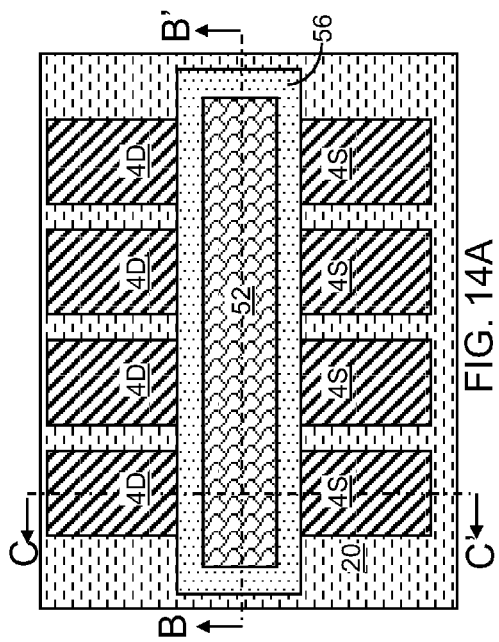
FIG. 14A is a top-down view of the fourth exemplary semiconductor structure after formation of raised source regions and raised drain regions according to the fourth embodiment of the present disclosure.
Figure 14C:
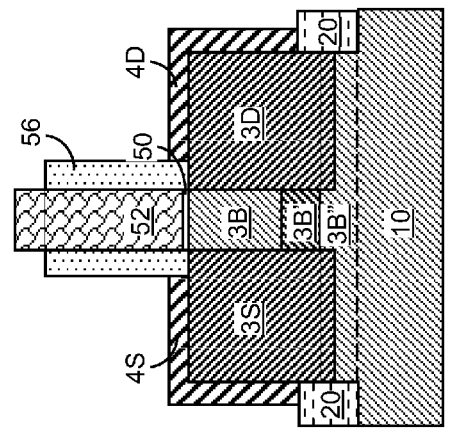
FIG. 14C is a vertical cross-sectional view of the fourth exemplary structure along the vertical plane C-C' in FIG. 14A.
Figure 14B:
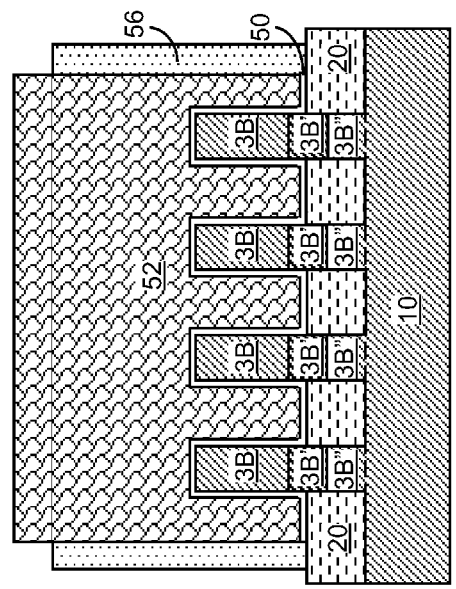
FIG. 14B is a vertical cross-sectional view of the fourth exemplary structure along the vertical plane B-B' in FIG. 14A.

Referring to FIGS. 14A-14C, electrical dopants (such as p-type dopants or n-type dopants) can be implanted into the portions of the semiconductor fins (31, 33, 35, 32, 34, 36; See FIGS. 13A-13C) to form fin active regions (3S, 3D). As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin.

The fin active regions (3S, 3D) include fin source regions 3S and fin drain regions 3D. The unimplanted portions of the semiconductor fins (31, 33, 35, 32, 34, 36; See FIGS. 13A-13C) constitute body regions (3B, 3B', 3B"). In one embodiment, each contiguous body region (3B, 3B', 3B") between a source region 3S and a drain region 3D within the same semiconductor fin includes an upper body region 3B, a punchthrough implant body region 3B', and a lower body region 3B".

Raised active regions (4S, 4D) are formed on physically exposed semiconductor surfaces of the semiconductor fins (3S, 3D, 3B, 3B', 3B") by selective deposition of a semiconductor material. As used herein, a "raised active region" refers to an active region (i.e., a source region or a drain region) that is located on, and outside, a semiconductor fin or a preexisting semiconductor material portion. In one embodiment, the selective deposition of the semiconductor material can be performed by a selective epitaxy process. During the selective epitaxy process, the deposited semiconductor material grows from physically exposed semiconductor surfaces, i.e., the physically exposed portions of the sidewalls and top surfaces of the fin active regions (3S, 3D), while the semiconductor material is not deposited on, and thus, does not grow from, dielectric surfaces such as the surfaces of the gate spacer 56 and the shallow trench isolation layer 20. The raised active regions (4S, 4D) can include raised source regions 4S and raised drain regions 4D. In one embodiment, each portion of the raised active regions (4S, 4D) can be epitaxially aligned to an underlying fin active region (3S, 3D). The raised active regions (4S, 4D) can include the same semiconductor material as, or a semiconductor material different from, the semiconductor material of the fin active regions (3S, 3D).

In one embodiment, the raised active regions (4S, 4D) can be formed with in-situ doping during the selective epitaxy process. Thus, each portion of the raised active regions (4S, 4D) can be formed as doped semiconductor material portions. Alternatively, the raised active regions (4S, 4D) can be formed as intrinsic semiconductor material portions and electrical dopants can be subsequently introduced into the raised active regions (4S, 4D) to convert the raised active regions 94S, 4D) into doped semiconductor material portions.

Referring to FIGS. 15A-15C, a planarization dielectric layer 60 can be deposited over the semiconductor fins (3S, 3D, 3B, 3B', 3B"), the raised active regions (4S, 4D), the disposable gate structure (50, 52), and the gate spacer 56. The planarization dielectric layer 60 includes a dielectric material such as silicon oxide, silicon nitride, organosilicate glass, a dielectric metal oxide, or combinations thereof. The planarization dielectric layer 60 is planarized, for example, by chemical mechanical planarization, so that the top surface of the planarization layer 60 is planar, i.e., within a two dimensional plane. The gate spacer 56 can be employed as a stopping layer during the planarization process. The top surfaces of the disposable gate structure (50, 52) and the gate spacer 56 can be coplanar with the top surface of the planarization dielectric layer 60 after the planarization process.

Figure 16A:
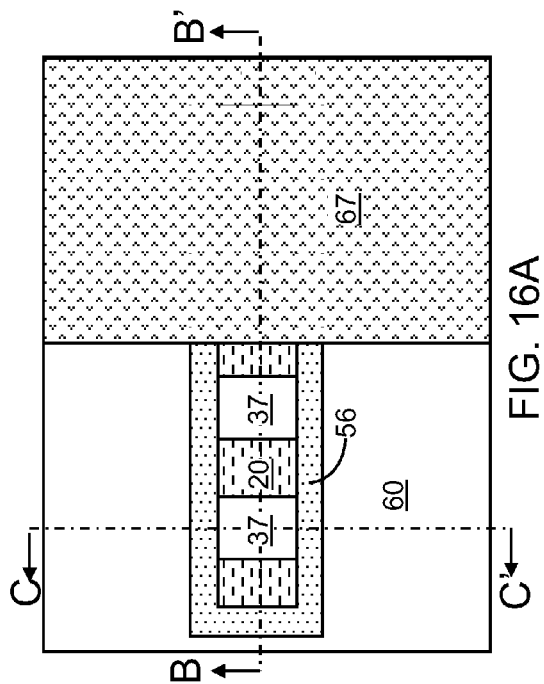
FIG. 16A is a top-down view of the fourth exemplary semiconductor structure after removal of the disposable gate stack, formation of an implantation mask layer, and implantation of oxygen according to the fourth embodiment of the present disclosure.
Figure 16C:
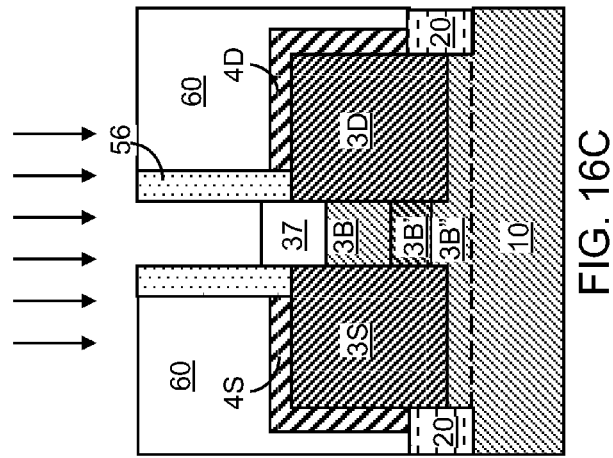
FIG. 16C is a vertical cross-sectional view of the fourth exemplary structure along the vertical plane C-C' in FIG. 16A.
Figure 16B:
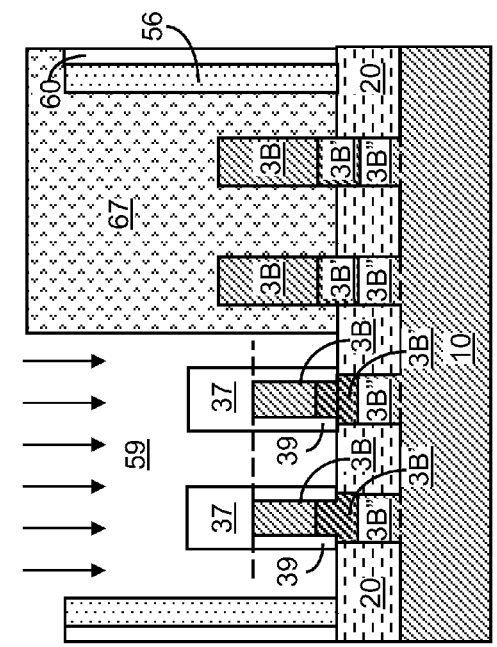
FIG. 16B is a vertical cross-sectional view of the fourth exemplary structure along the vertical plane B-B' in FIG. 16A.
Figure 17A:
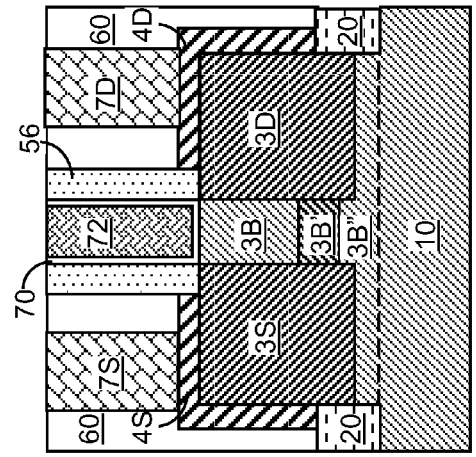
FIG. 17A is a top-down view of the fourth exemplary semiconductor structure after removal of semiconductor oxide portions and formation of a replacement gate structure according to the fourth embodiment of the present disclosure.
Figure 17D:
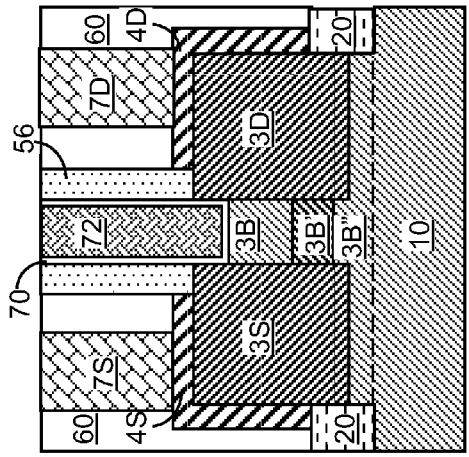
FIG. 17D is a vertical cross-sectional view of the fourth exemplary structure along the vertical plane D-D' in FIG. 17A.
Figure 17B:
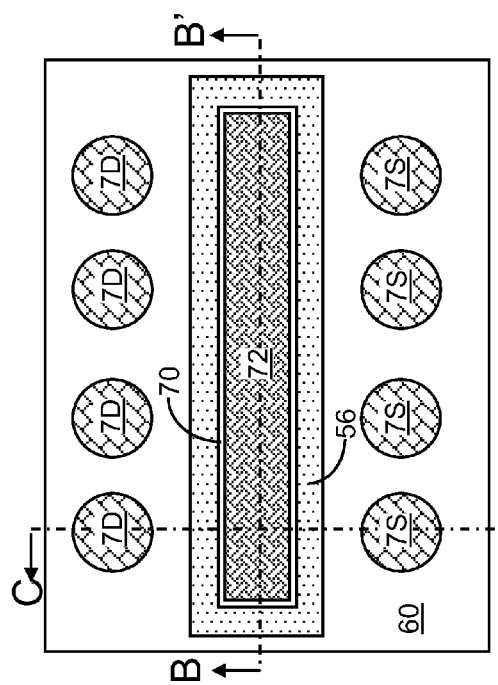
FIG. 17B is a vertical cross-sectional view of the fourth exemplary structure along the vertical plane B-B' in FIG. 17A.
Figure 17C:
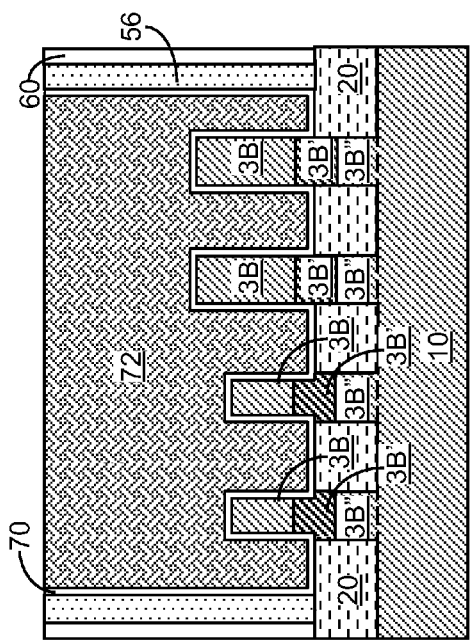
FIG. 17C is a vertical cross-sectional view of the fourth exemplary structure along the vertical plane C-C' in FIG. 17A.

Referring to FIGS. 16A-16C, the disposable gate structure (50, 52) is removed selective to the planarization dielectric layer 60, the gate spacer 56, the semiconductor fins (3S, 3D, 3B, 3B', 3B"), and optionally selective to the shallow trench isolation layer 20. A gate cavity 59 is formed by removing the disposable gate structure (50, 52) selective to the planarization dielectric layer 60. The physically exposed portion of the top surfaces of the semiconductor fins (3S, 3D, 3B, 3B', 3B") are provided underneath the gate cavity 59.

An implantation mask layer 57 can be formed over a first subset of the semiconductor fins (3S, 3D, 3B, 3B', 3B") so that the first subset of the semiconductor fins (3S, 3D, 3B, 3B', 3B") is physically covered with the implantation mask layer 67, while a complementary subset of the semiconductor fins (3S, 3D, 3B, 3B', 3B") is not physically covered with the implantation mask layer 57. The implantation mask layer 67 can be, for example, a patterned photoresist layer.

Within the region that is not covered with the implantation mask layer 67, a portion of a top surface of a semiconductor fin (3S, 3D, 3B, 3B', 3B") can be physically exposed underneath the gate cavity 59 while another portion of the top surface of the semiconductor fin (3S, 3D, 3B, 3B', 3B") is covered with the planarization dielectric layer 60. The various semiconductor fins (3S, 3D, 3B, 3B', 3B") can be masked with a combination of the masking structures, which can include a patterned masking layer, i.e., the implantation mask layer 67, the gate spacer 56, and the planarization dielectric layer 60. In one embodiment, the patterned masking layer does not cover a region of the gate cavity 59 that overlies at least one semiconductor fin (3S, 3D, 3B, 3B', 3B"), and covers another region of the gate cavity 59 that overlies at least another semiconductor fin (3S, 3D, 3B, 3B', 3B").

Surface portions of the semiconductor fins (3S, 3D, 3B, 3B', 3B") within regions that are not masked by the combination of masking structures are converted into semiconductor oxide portions (37, 39). In one embodiment, an oxygen cluster implantation process may be employed, in which clusters of oxygen atoms are implanted into the surface portion of the semiconductor fins (3S, 3D, 3B, 3B', 3B"). The combination of masking structures are employed to block the oxygen cluster beams during the oxygen cluster implantation process. Thus, the gate spacer 56 can block the clusters of oxygen atoms during the oxygen cluster implantation process.

In one embodiment, a directional ion beam can impinge on the physically exposed portions of the semiconductor fins (3S, 3D, 3B, 3B', 3B") along a vertical direction. In one embodiment, the directional ion beam can include ionized clusters of oxygen atoms, which are implanted through top surfaces of the semiconductor fins (3S, 3D, 3B, 3B', 3B") to form at least one top semiconductor oxide portion 37. In one embodiment, the directional ion beam can include oxygen and the at least one top semiconductor oxide portion 37 can include silicon oxide.

Additional semiconductor oxide portions, which are herein referred to as second semiconductor oxide portions 39, can be formed on sidewalls of the physically exposed semiconductor fins (3S, 3D, 3B, 3B', 3B"). Further, the second semiconductor oxide portions 39 may be formed on widthwise sidewalls of the semiconductor fins (3S, 3D, 3B, 3B', 3B"). The formation of the second semiconductor oxide portions 39 can be due to imperfect shading of the ion clusters, angular spread of the ion clusters, and/or scatter of the ion clusters during the angled ion beam implantation process. A set including a top semiconductor oxide portion 37 and second semiconductor oxide portions 39 can form a contiguous semiconductor oxide portion that overlies and laterally surrounds a semiconductor fin (3S, 3D, 3B, 3B', 3B"). The implantation mask layer 67 can be subsequently removed, for example, by ashing.

Referring to FIGS. 17A-17D, the top semiconductor oxide portion(s) 37 and the second semiconductor oxide portions 37 can be removed by an isotropic etch selective to the semiconductor material of the semiconductor fins (3S, 3D, 3B, 3B', 3B"). For example, a wet etch employing hydrofluoric acid can be employed to remove the semiconductor oxide portions (37, 39).

Subsequently, a stack of a gate dielectric 70 and a gate electrode 72 can be formed directly on surfaces of the semiconductor fins (3S, 3D, 3B, 3B', 3B") from which the semiconductor oxide portions (37, 39) are removed. The stack of the gate dielectric 70 and the gate electrode 72 can be formed as a replacement gate structure, for example, by depositing a gate dielectric layer and a conductive material layer to fill the gate cavity 59, and by removing excess portions of the gate dielectric layer and the conductive material layer from above a horizontal plane including the top surface of the planarization dielectric layer employing a planarization process such as chemical mechanical planarization.

Source side contact via structures 7S and drain side contact via structures 7D can be formed through the planarization dielectric layer 60 and onto the raised source regions 4S or onto the raised drain regions 4D, respectively.

The fourth exemplary semiconductor structure includes a semiconductor fin (3S, 3D, 3B, 3B', 3B") (e.g., one of the two left side semiconductor fins in FIG. 17B) located on a substrate such as the semiconductor material layer 10. The semiconductor fin can have the semiconductor composition throughout. As used herein, a "semiconductor composition" refers to a composition of a semiconductor material that excludes electrical dopants. Each body region (3B, 3B', 3B") can have a different dopant composition than a fin source region 3S and a fin drain region 3D that are present within the semiconductor fin (3S, 3D, 3B, 3B', 3B"). The body regions (3B, 3B', 3B") can have the opposite type of doping than the source regions (3S, 4S) and the drain regions (3D, 4D). A top surface of the body region (3B, 3B', 3B") is recessed relative to the top surfaces of the fin source region 3S and the fin drain region 3D. A gate stack (70, 72) straddles the body region (3B, 3B', 3B"). Sidewalls of a gate dielectric 70 within the gate stack (70, 72) contact sidewalls of the fin source region 3S and the fin drain region 3D.

In one embodiment, another semiconductor fin (3S, 3D, 3B, 3B', 3B") (e.g., one of the two right side semiconductor fins in FIG. 17B) located on the substrate. A top surface of another body region (3B, 3B', 3B") that is present within this semiconductor fin (3S, 3D, 3B, 3B', 3B") can be coplanar with top surfaces of another fin source region 3S and another fin drain region 3D that are present within this semiconductor fin (3S, 3D, 3B, 3B', 3B"). In one embodiment, the entire top surface of the semiconductor fin (3S, 3D, 3B, 3B', 3B") can be coplanar, i.e., located within a single horizontal plane. In this case, the top surface of the body region of this semiconductor fin (3S, 3D, 3B, 3B', 3B") can be within the same horizontal plane as the top surfaces of the fin source region 3S and the fin drain region 3D of the semiconductor fin (3S, 3D, 3B, 3B', 3B").

The gate stack (70, 72) can straddle the plurality of semiconductor fins (3S, 3D, 3B, 3B', 3B"). The gate spacer 56 can include inner sidewalls that vertically coincide with the sidewalls of the gate dielectric 70. In one embodiment, the upper portion of the body region (3B, 3B', 3B") can be thinned during the lateral thinning process through formation and removal of the second semiconductor oxide portions 39. In this case, the fin source region 3S and the fin drain region 3D can have a greater width than an upper portion of the body region (3B, 3B', 3B") and can have the same width as a lower portion of the body region (3B, 3B', 3B").

Figure 18C:
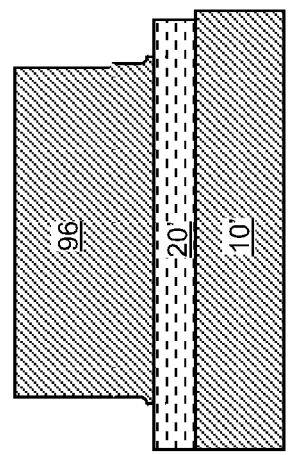
FIG. 18C is a vertical cross-sectional view of the first variation of the first exemplary structure along the vertical plane C-C' in FIG. 18A.
Figure 18A:
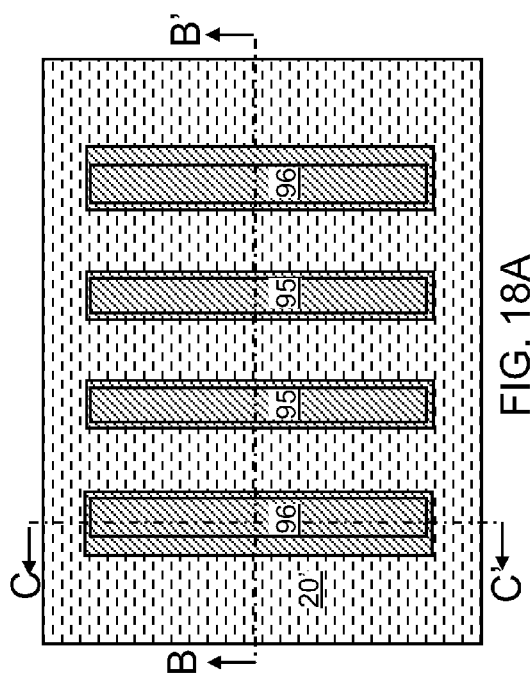
FIG. 18A is a top-down view of a first variation of the first exemplary semiconductor structure according to the first embodiment of the present disclosure.
Figure 18B:
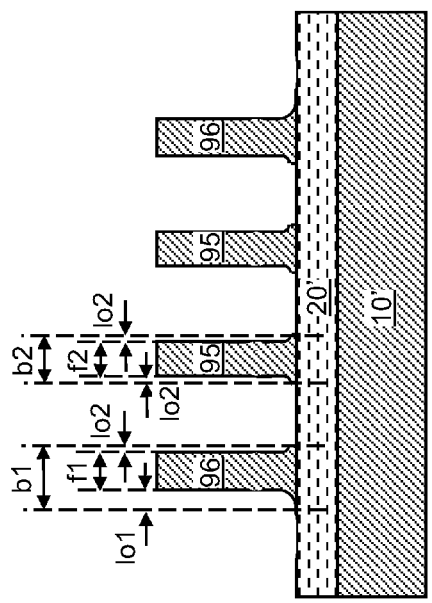
FIG. 18B is a vertical cross-sectional view of the first variation of the first exemplary structure along the vertical plane B-B' in FIG. 18A.

Referring to FIGS. 18A-18C, a first variation of the first exemplary semiconductor structure can be derived from the first exemplary semiconductor structure by substituting a semiconductor-on-insulator (SOI) substrate including a handle substrate 10' and a buried insulator layer 20' in lieu of a bulk semiconductor substrate. The same processing steps can be employed as in the first embodiment. The semiconductor fins (95, 96) can have the same geometrical features as the semiconductor fins (31, 33, 35, 32, 34, 36) of the first exemplary semiconductor structure illustrated in FIGS. 4A-4C.

Figure 19A:
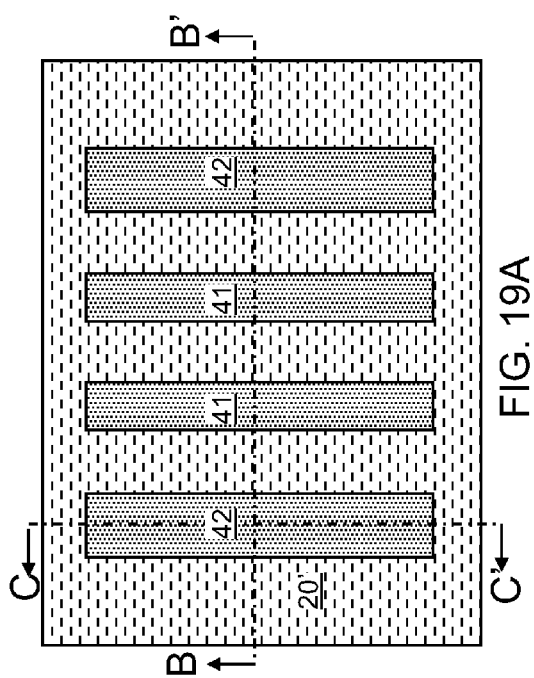
FIG. 19A is a top-down view of a first variation of the second exemplary semiconductor structure according to the second embodiment of the present disclosure.
Figure 19B:
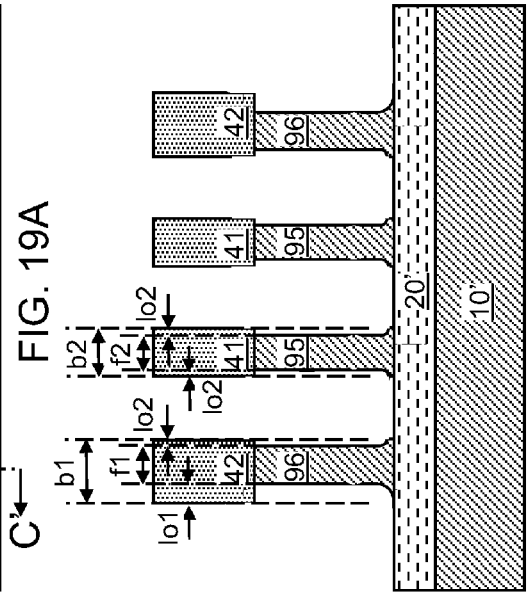
FIG. 19B is a vertical cross-sectional view of the first variation of the second exemplary structure along the vertical plane B-B' in FIG. 19A.
Figure 19C:
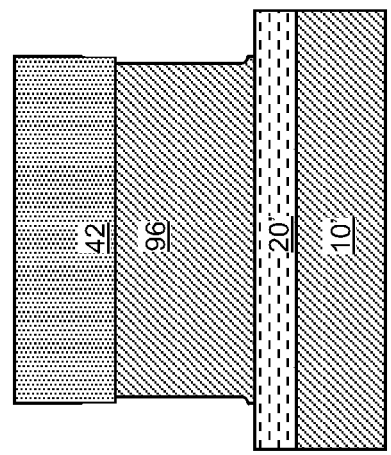
FIG. 19C is a vertical cross-sectional view of the first variation of the second exemplary structure along the vertical plane C-C' in FIG. 19A.

Referring to FIGS. 19A-19C, a first variation of the second exemplary semiconductor structure can be derived from the second exemplary semiconductor structure by substituting a semiconductor-on-insulator (SOI) substrate including a handle substrate 10' and a buried insulator layer 20' in lieu of a bulk semiconductor substrate. The same processing steps can be employed as in the second embodiment. The semiconductor fins (95, 96) can have the same geometrical features as the semiconductor fins (31, 33, 35, 32, 34, 36) of the second exemplary semiconductor structure illustrated in FIGS. 8A-8C.

Figure 20C:
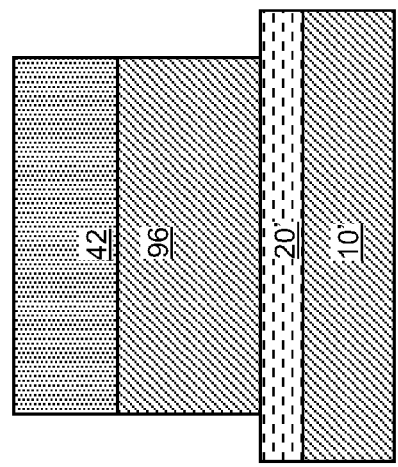
FIG. 20C is a vertical cross-sectional view of the first variation of the third exemplary structure along the vertical plane C-C' in FIG. 20A.
Figure 20A:
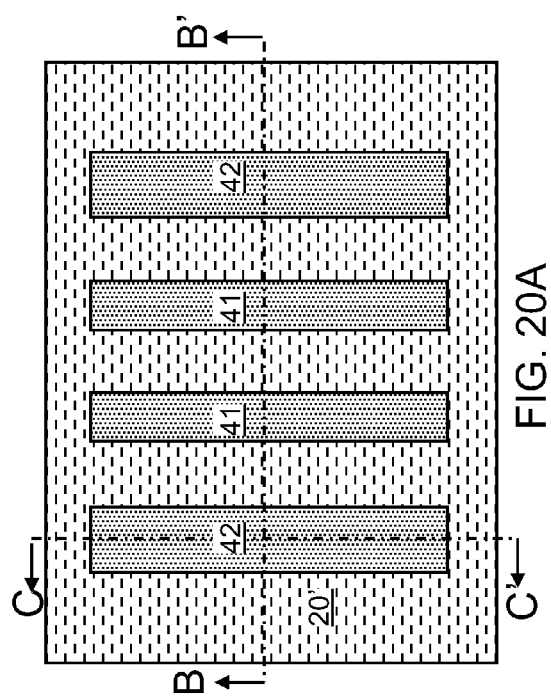
FIG. 20A is a top-down view of a first variation of the third exemplary semiconductor structure according to the third embodiment of the present disclosure.
Figure 20B:
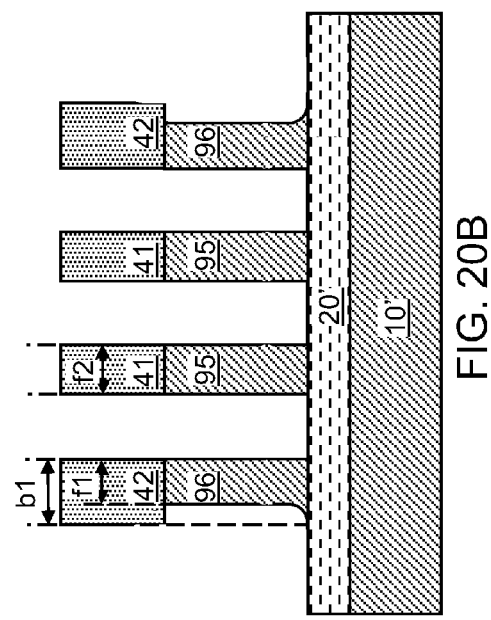
FIG. 20B is a vertical cross-sectional view of the first variation of the third exemplary structure along the vertical plane B-B' in FIG. 20A.

Referring to FIGS. 20A-20C, a first variation of the third exemplary semiconductor structure can be derived from the third exemplary semiconductor structure by substituting a semiconductor-on-insulator (SOI) substrate including a handle substrate 10' and a buried insulator layer 20' in lieu of a bulk semiconductor substrate. The same processing steps can be employed as in the third embodiment. The semiconductor fins (95, 96) can have the same geometrical features as the semiconductor fins (31, 33, 35, 32, 34, 36) of the third exemplary semiconductor structure illustrated in FIGS. 10A-10C or in FIGS. 11A-11C.

Figure 21C:
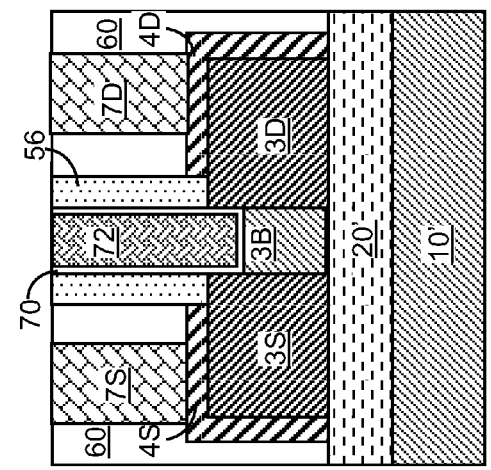
FIG. 21C is a vertical cross-sectional view of the variation of the fourth exemplary structure along the vertical plane C-C' in FIG. 21A.
Figure 21A:
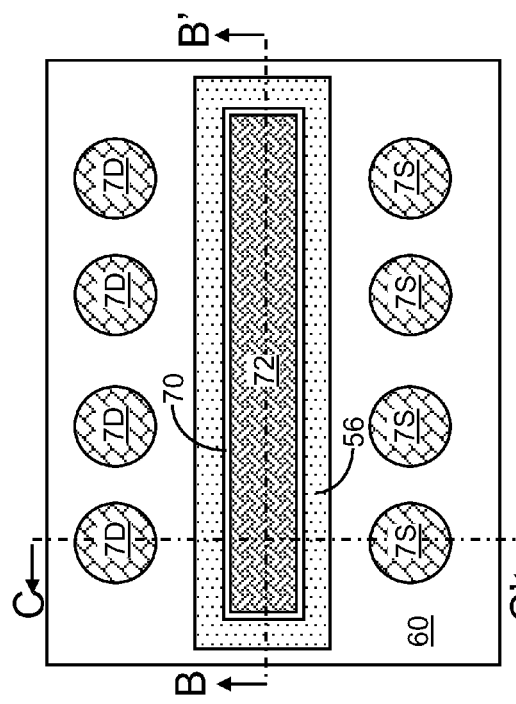
FIG. 21A is a top-down view of a variation of the fourth exemplary semiconductor structure according to the fourth embodiment of the present disclosure.
Figure 21B:
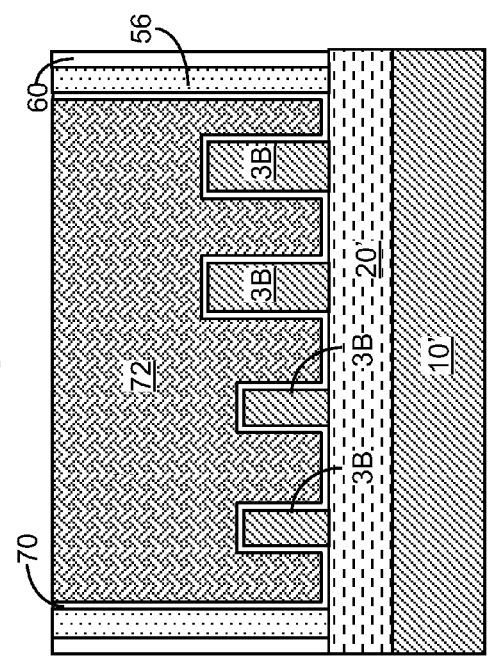
FIG. 21B is a vertical cross-sectional view of the variation of the fourth exemplary structure along the vertical plane B-B' in FIG. 21A.

Referring to FIGS. 21A-21C, a variation of the fourth exemplary semiconductor structure can be derived from the fourth exemplary semiconductor structure by substituting a semiconductor-on-insulator (SOI) substrate including a handle substrate 10' and a buried insulator layer 20' in lieu of a bulk semiconductor substrate. The same processing steps can be employed as in the third embodiment. The semiconductor fins (3S, 3D, 3B), the gate structure (70, 72), and the gate spacer 56 can have the same geometrical features as the semiconductor fins (3S, 3D, 3B) of the fourth exemplary semiconductor structure illustrated in FIGS. 10A-10C or in FIGS. 11A-11C.

Figure 22A:
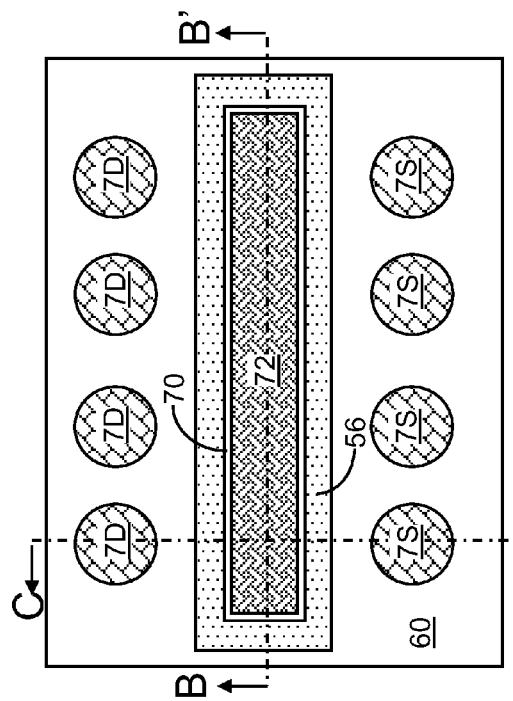
FIG. 22A is a top-down view of a second variation of the first or second exemplary semiconductor structure according to the second embodiment of the present disclosure.
Figure 22C:
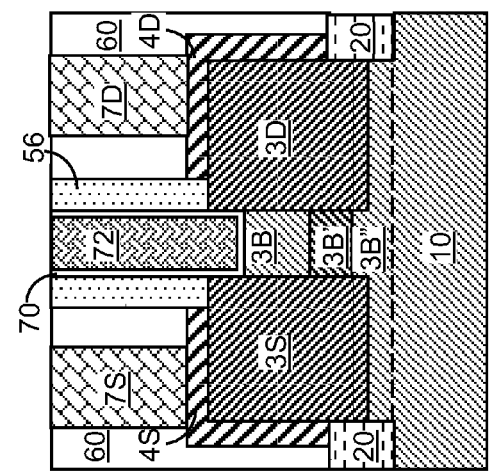
FIG. 22C is a vertical cross-sectional view of the second variation of the first or second exemplary structure along the vertical plane C-C' in FIG. 22A.
Figure 22B:
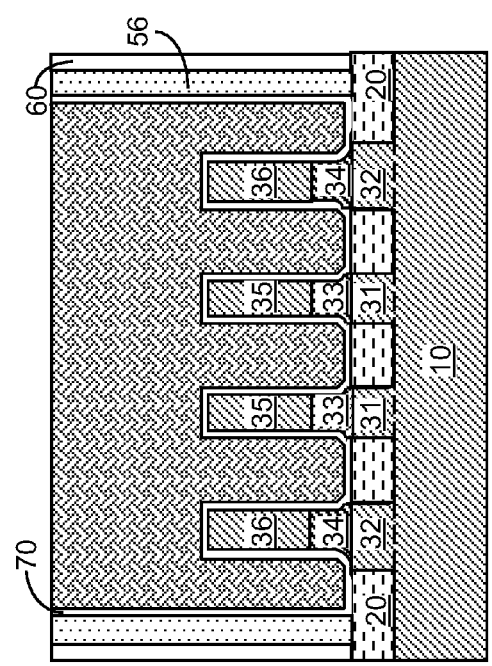
FIG. 22B is a vertical cross-sectional view of the second variation of the first or second exemplary structure along the vertical plane B-B' in FIG. 22A.
Figure 23A:
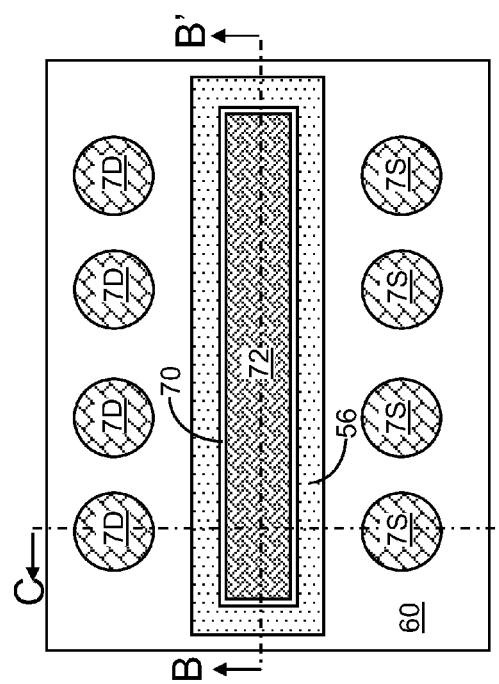
FIG. 23A is a top-down view of a second variation of the third exemplary semiconductor structure according to the third embodiment of the present disclosure.
Figure 23C:
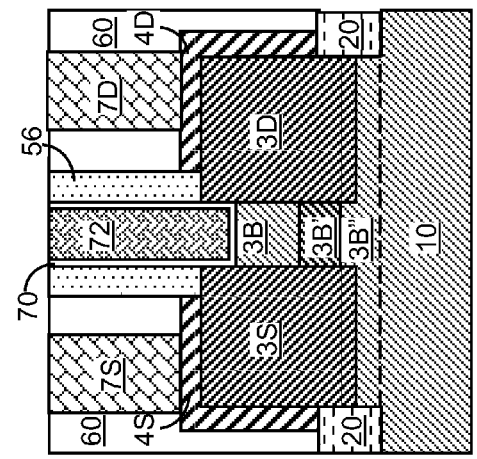
FIG. 23C is a vertical cross-sectional view of the second variation of the third exemplary structure along the vertical plane C-C' in FIG. 23A.
Figure 23B:
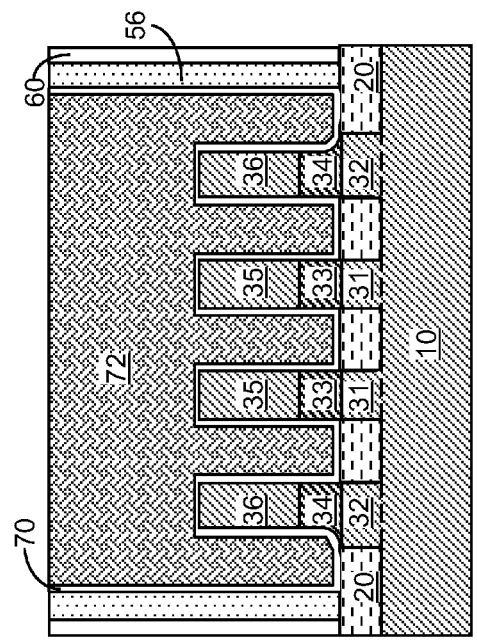
FIG. 23B is a vertical cross-sectional view of the second variation of the third exemplary structure along the vertical plane B-B' in FIG. 23A.

Referring to FIGS. 22A-22C, a second variation of the first or second exemplary semiconductor structure according to the second embodiment of the present disclosure can be derived from the first or second exemplary semiconductor structure illustrated in FIGS. 4A-4C by performing the processing steps of FIGS. 13A-13C, 14A-14C, 15A-15C, 16A-16C, and 17A-17D.

Referring to FIGS. 22A-22C, a second variation of the third exemplary semiconductor structure according to the third embodiment of the present disclosure can be derived from the third exemplary semiconductor structure illustrated in FIGS. 11A-11C by performing the processing steps of FIGS. 13A-13C, 14A-14C, 15A-15C, 16A-16C, and 17A-17D.

The various methods of the present disclosure can provide vertical and/or lateral thinning of semiconductor fins at selected locations, which can be the outermost semiconductor fins and/or arbitrarily selected semiconductor fins determined by the pattern of an implantation mask layer.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor fin on a substrate;
    forming a planarization dielectric layer over said semiconductor fin, wherein a first portion of a top surface of said semiconductor fin is not covered with said planarization dielectric layer, and a second portion of said top surface of said semiconductor fin is covered with said planarization dielectric layer;
    converting said first portion of said top surface of said semiconductor fin into a semiconductor oxide portion employing an oxygen cluster implantation process in which clusters of oxygen atoms are implanted into said first portion of said semiconductor fin; and
    removing said semiconductor oxide portion,
    wherein said first portion corresponds to an active region of said semiconductor fin, and said second portion corresponds to a body region of said semiconductor fin.

2. The method of claim 1, further comprising
    forming a disposable gate structure across said semiconductor fin, wherein said planarization dielectric layer is formed around said disposable gate structure and over said semiconductor fin; and
    forming a gate cavity by removing said disposable gate structure selective to said planarization dielectric layer, wherein said first portion of said top surface of said semiconductor fin is formed underneath said gate cavity.

3. The method of claim 2, further comprising:
    forming another semiconductor fin on said substrate; and
    masking said another semiconductor fin with a combination of a patterned masking layer and said planarization dielectric layer during said oxygen cluster implantation process.

4. The method of claim 3, wherein said disposable gate structure is formed across said another semiconductor fin, and said patterned masking layer does not cover a region of said gate cavity that overlies said semiconductor fin and covers another region of said gate cavity that overlies said another semiconductor fin.

5. The method of claim 2, further comprising
    forming a gate spacer around said disposable gate stack prior to formation of said planarization dielectric layer, wherein said gate spacer blocks said clusters of oxygen atoms during said oxygen cluster implantation process.

6. The method of claim 1, further comprising forming a stack of a gate dielectric and a gate electrode directly on a surface of said semiconductor fin from which said semiconductor oxide portion is removed.

7. A method of forming a semiconductor structure comprising:
   forming a plurality of semiconductor fins including two outermost semiconductor fins on a substrate;
   forming semiconductor oxide portions on outermost sidewalls of said plurality of semiconductor fins employing an oxygen cluster implantation process in which clusters of oxygen atoms are implanted into physically exposed and unshaded surface portions of said two outermost semiconductor fins while inner sidewalls of said two outermost semiconductor fins are at least partially shaded; and
   laterally thinning said two outermost semiconductor fins by removing said semiconductor oxide portions.

8. The method of claim 7, wherein said plurality of semiconductor fins further includes at least one nested semiconductor fin located between said two outermost semiconductor fins, wherein sidewalls of said at least one nested semiconductor fin are at least partially shaded during said oxygen cluster implantation process.

9. The method of claim 8, further comprising forming a gate stack across said plurality of semiconductor fins after said two outermost semiconductor fins are thinned.

10. The method of claim 7, wherein additional semiconductor oxide portions are formed on inner sidewalls of said two outermost semiconductor fins, wherein said semiconductor oxide portions on said outermost sidewalls of said plurality of semiconductor fins have a greater thickness than said additional semiconductor oxide portions.

11. The method of claim 7, wherein said plurality of semiconductor fins is formed within a plurality of fin stacks, wherein each of said fin stacks includes a semiconductor fin and a fin cap structure, and said fin cap structures provide shading of said clusters of oxygen atoms during said oxygen cluster implantation process.

12. The method of claim 11, wherein said fin cap structures provide full shading of inner sidewalls of said two outermost semiconductor fins, and no semiconductor oxide portion is formed on said inner sidewalls of said two outermost semiconductor fins by said oxygen cluster implantation process.

13. The method of claim 11, further comprising removing said fin cap structures after said oxygen cluster implantation process.

\* \* \* \* \*